(12) United States Patent
Fukuoka et al.

(10) Patent No.: US 12,002,832 B2
(45) Date of Patent: Jun. 4, 2024

(54) SOLID-STATE IMAGE SENSOR, SOLID-STATE IMAGING DEVICE, AND METHOD OF MANUFACTURING SOLID-STATE IMAGE SENSOR

(71) Applicants: SONY CORPORATION, Tokyo (JP); SONY SEMICONDUCTOR SOLUTIONS CORPORATION, Kanagawa (JP)

(72) Inventors: Shinpei Fukuoka, Kanagawa (JP); Moe Takeo, Tokyo (JP); Sho Nishida, Tokyo (JP); Hideaki Togashi, Kumamoto (JP); Takushi Shigetoshi, Kumamoto (JP); Junpei Yamamoto, Kanagawa (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 583 days.

(21) Appl. No.: 17/261,233

(22) PCT Filed: Jul. 23, 2019

(86) PCT No.: PCT/JP2019/028900
§ 371 (c)(1),
(2) Date: Jan. 19, 2021

(87) PCT Pub. No.: WO2020/022349
PCT Pub. Date: Jan. 30, 2020

(65) Prior Publication Data
US 2021/0273008 A1      Sep. 2, 2021

(30) Foreign Application Priority Data

Jul. 26, 2018   (JP) ................................ 2018-140151

(51) Int. Cl.
*H01L 27/146* (2006.01)

(52) U.S. Cl.
CPC .. *H01L 27/14636* (2013.01); *H01L 27/14683* (2013.01)

(58) Field of Classification Search
CPC ................... H01L 27/14636; H01L 27/14683
See application file for complete search history.

(56) References Cited

U.S. PATENT DOCUMENTS

2014/0312506 A1    10/2014   Hayashi et al.
2015/0001663 A1    1/2015    Lee
(Continued)

FOREIGN PATENT DOCUMENTS

JP       2018-098495       6/2018
WO    WO 2013/103136    7/2013
(Continued)

OTHER PUBLICATIONS

International Search Report prepared by the Japan Patent Office dated Sep. 26, 2019, for International Application No. PCT/JP2019/028900.

*Primary Examiner* — Peniel M Gumedzoe
(74) *Attorney, Agent, or Firm* — Sheridan Ross PC

(57) ABSTRACT

A solid-state image sensor is provided that includes a semiconductor substrate, a charge accumulator disposed in the semiconductor substrate and configured to accumulate charge, a photoelectric converter provided above the semiconductor substrate and configured to convert light to charge, and a through electrode passing through the semiconductor substrate and electrically connecting the charge accumulator with the photoelectric converter. At an end portion on the photoelectric converter side of the through electrode, a cross-sectional area of a conductor positioned at the center of the through electrode in a cut section orthogo-
(Continued)

nal to a through direction of the through electrode gradually increases toward the photoelectric converter along the through direction.

20 Claims, 21 Drawing Sheets

(56) References Cited

U.S. PATENT DOCUMENTS

2016/0204156 A1* 7/2016 Togashi .............. H01L 27/1464
                                                            257/292
2018/0240847 A1   8/2018 Ota et al.
2018/0286922 A1* 10/2018 Togashi ................ H10K 19/20

FOREIGN PATENT DOCUMENTS

WO    WO 2016/143531    9/2016
WO    WO 2018/066256    4/2018

* cited by examiner

SOLID-STATE IMAGE SENSOR, SOLID-STATE IMAGING DEVICE, AND METHOD OF MANUFACTURING SOLID-STATE IMAGE SENSOR

CROSS REFERENCE TO RELATED APPLICATIONS

This application is a national stage application under 35 U.S.C. 371 and claims the benefit of PCT Application No. PCT/JP2019/028900 having an international filing date of 23 Jul. 2019, which designated the United States, which PCT application claimed the benefit of Japanese Patent Application No. 2018-140151 filed 26 Jul. 2018, the entire disclosures of each of which are incorporated herein by reference.

FIELD

The present disclosure relates to a solid-state image sensor, a solid-state imaging device, and a method of manufacturing a solid-state image sensor.

BACKGROUND

In solid-state image sensors such as charge-coupled device (CCD) image sensors and complementary metal-oxide-semiconductor (CMOS) image sensors, provision of a through electrode for each pixel (solid-state image sensor) has been contemplated. An example of such solid-state image sensors is a solid-state image sensor disclosed in Patent Literature 1 below.

CITATION LIST

Patent Literature

Patent Literature 1: JP 2017-073436 A

SUMMARY

Technical Problem

Unfortunately, in the through electrode disclosed in Patent Literature 1 above, it is difficult to keep the resistance value of the through electrode low.

In view of such a situation, the present disclosure proposes a new and improved solid-state image sensor having a through electrode with a resistance value kept low, a solid-state imaging device, and a method of manufacturing a solid-state image sensor.

Solution to Problem

According to the present disclosure, a solid-state image sensor is provided that includes: a semiconductor substrate; a charge accumulator disposed in the semiconductor substrate and configured to accumulate charge; a photoelectric converter disposed above the semiconductor substrate and configured to convert light to charge; and a through electrode passing through the semiconductor substrate and electrically connecting the charge accumulator with the photoelectric converter, wherein at an end portion on the photoelectric converter side of the through electrode, a cross-sectional area of a conductor positioned at a center of the through electrode in a cut section orthogonal to a through direction of the through electrode gradually increases toward the photoelectric converter along the through direction.

Moreover, according to the present disclosure, a solid-state imaging device is provided that includes a plurality of solid-state image sensors arranged in a matrix, each of the solid-state image sensors comprising: a semiconductor substrate; a charge accumulator disposed in the semiconductor substrate and configured to accumulate charge; a photoelectric converter disposed above the semiconductor substrate and configured to convert light to charge; and a through electrode passing through the semiconductor substrate and electrically connecting the charge accumulator with the photoelectric converter, wherein at an end portion on the photoelectric converter side of the through electrode, a cross-sectional area of a conductor positioned at a center of the through electrode in a cut section orthogonal to a through direction of the through electrode gradually increases toward the photoelectric converter along the through direction.

Moreover, according to the present disclosure, A method of manufacturing a solid-state image sensor is provided, the image sensor includes a semiconductor substrate, a charge accumulator disposed in the semiconductor substrate and configured to accumulate charge, a photoelectric converter disposed above the semiconductor substrate and configured to convert light to charge, and a through electrode passing through the semiconductor substrate and electrically connecting the charge accumulator with the photoelectric converter, wherein at an end portion on the photoelectric converter side of the through electrode, a cross-sectional area of a conductor positioned at a center of the through electrode in a cut section orthogonal to a through direction of the through electrode gradually increases toward the photoelectric converter along the through direction, the method includes: forming a through hole passing through the semiconductor substrate; depositing an insulating film to cover an inner wall of the through hole; etching the insulating film at an end portion on the photoelectric converter side of the through hole; and filling the through hole with a metal film.

Advantageous Effects of Invention

As described above, the present disclosure can keep the resistance value of the through electrode low.

The effect above is not necessarily limitative, and any effects shown in the present description or other effects that may be construed from the present description may be achieved in addition to or instead of the effect above.

DESCRIPTION OF EMBODIMENTS

Figure 1:
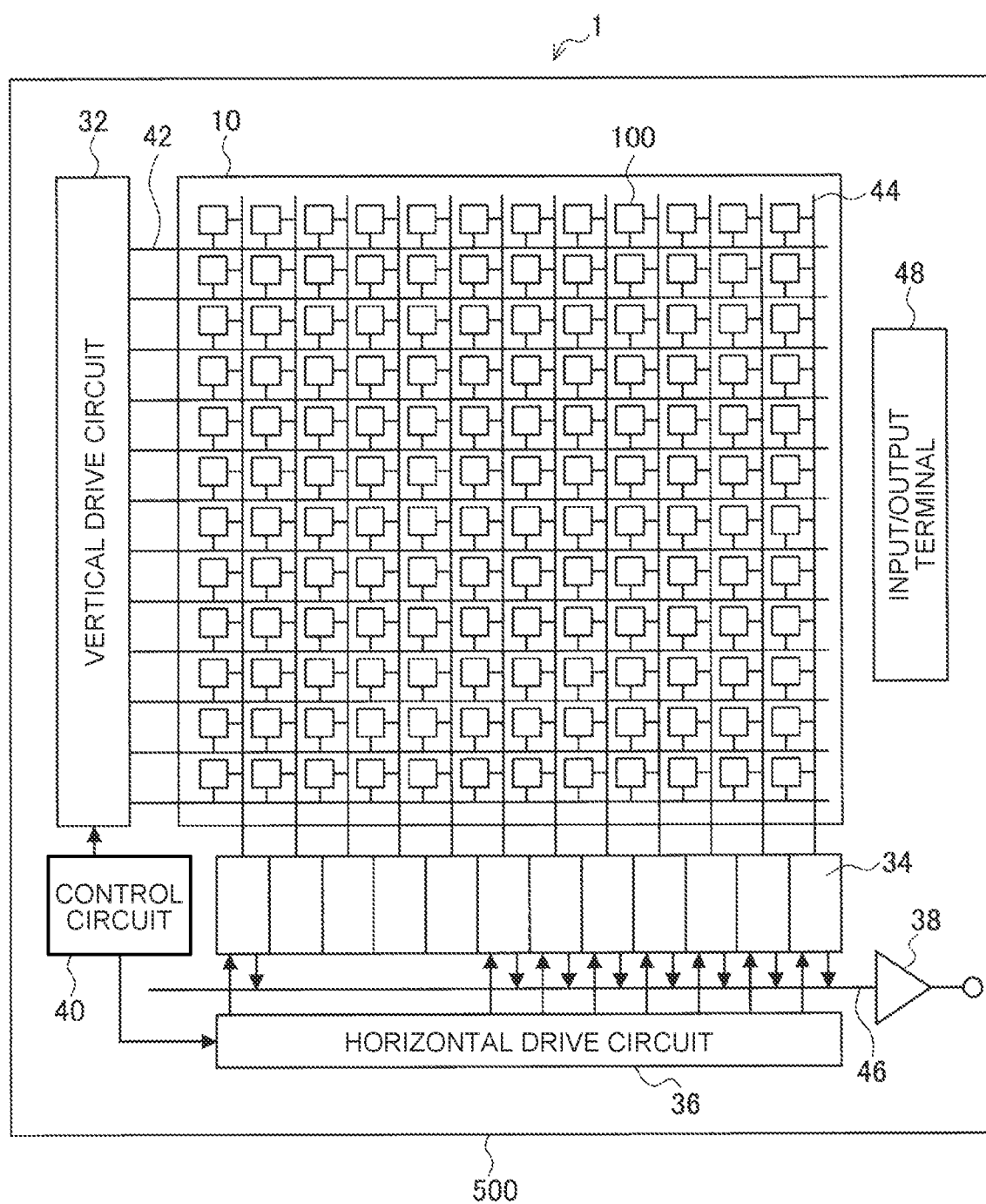
FIG. 1 is a plan view schematically illustrating a solid-state imaging device 1 according to embodiments of the present disclosure.

Preferred embodiments of the present disclosure will be described in detail with reference to the accompanying drawings. In the present description and drawings, the constituent elements having substantially the same functional configuration are denoted by the same reference sign and an overlapping description is omitted.

In the present description and drawings, similar constituent elements in different embodiments may be denoted by the same reference sign followed by different alphabets so that they are distinguished from each other. However, when the similar constituent elements need not be distinguished from each other, they are denoted only by the same reference sign.

The drawings referred to in the following description are intended for description of embodiments of the present disclosure and to facilitate understanding thereof, and the shape, dimensions, and ratio illustrated in the drawings may be different from the actual ones for ease of understanding. The solid-state image sensor and the solid-state imaging device illustrated in the drawings can be modified as appropriate in consideration of the following description and known techniques. The up-down direction of a stack structure of the solid-state image sensor in a description using a cross-sectional view of the solid-state image sensor corresponds to a relative direction when a light incident surface on which light enters the solid-state image sensor is the upper side, and may differ from the up-down direction in accordance with the actual acceleration of gravity.

A specific size or shape in the following description is not intended to mean only the same value as a mathematically defined numerical value or a geometrically defined shape but includes differences to a degree industrially acceptable in the manufacturing process of solid-state image sensors or shapes similar to the specific shape. For example, in the following description, the expression "cylindrical shape" or "substantially cylindrical shape" is not limited to a cylinder having a top face and a bottom face shaped in a perfect circle but also means a cylinder having a top face and a bottom face having a shape similar to a perfect circle, such as an oval shape.

In the following description of a circuit configuration, "electrically connect" means connecting a plurality of elements to each other such that electrical continuity is established, unless otherwise specified. In addition, "electrically connect" in the following description not only includes directly and electrically connecting a plurality of elements but also includes indirectly and electrically connecting the elements through another element.

In the following description, "gate" represents the gate electrode of a field-effect transistor (FET). "Drain" represents the drain electrode or drain region of a FET, and "source" means the source electrode or source region of a FET.

The description will be given in the following order.
1. Overall Configuration of Solid-State Imaging Device 1
2. Equivalent Circuit of Solid-State Image Sensor 100
3. Stack Structure of Solid-State Image Sensor 100
4. Circumstances Leading to Making of Embodiments of the Present Invention
5. First Embodiment
   5.1 Detailed Configuration of Through Electrode 600
   5.2 Method of Manufacturing Solid-State Image Sensor 100
   5.3 Modification
6. Second Embodiment
7. Third Embodiment
8. Fourth Embodiment
9. Fifth Embodiment
10. Sum-up
11. Application to Endoscopic Surgery System
12. Application to Movable Body
13. Supplemental Remarks

1. Overall Configuration of Solid-State Imaging Device 1

First of all, prior to a description of embodiments according to the present disclosure, referring to FIG. 1, an overall configuration of a solid-state imaging device 1 according to embodiments of the present disclosure will be described. FIG. 1 is a plan view schematically illustrating the solid-state imaging device 1 according to the present embodiment. As illustrated in FIG. 1, the solid-state imaging device 1 according to the present embodiment includes a pixel array 10 in which a plurality of solid-state image sensors (pixels) 100 are arranged in a matrix on a semiconductor substrate 500 made of silicon, for example. As illustrated in FIG. 1, the solid-state imaging device 1 further includes a vertical drive circuit 32, a column signal processing circuit 34, a horizontal drive circuit 36, an output circuit 38, and a control circuit 40. The detail of each block of the solid-state imaging device 1 according to the present embodiment will be described below.

(Pixel Array 10)

Figure 4:
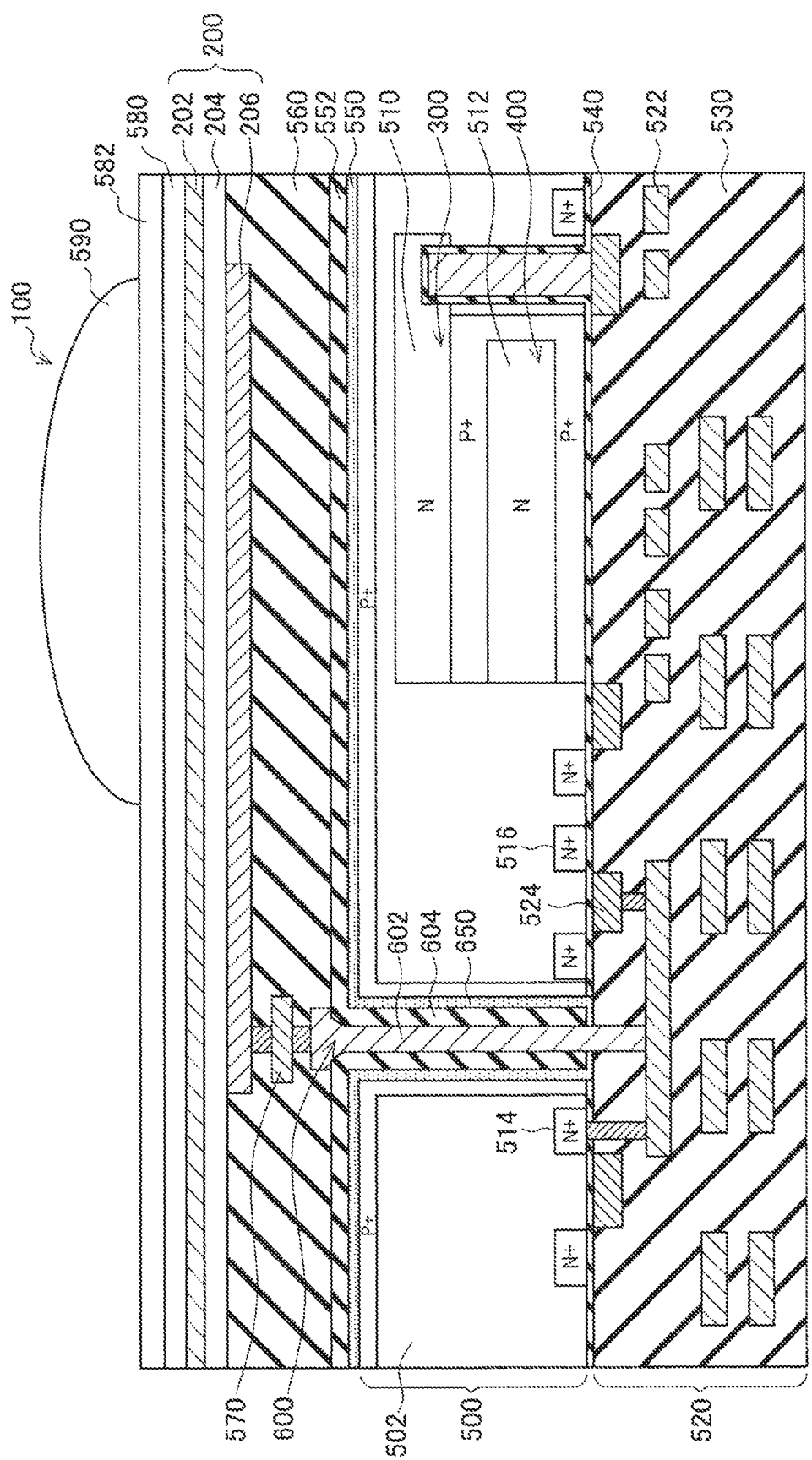
FIG. 4 is a cross-sectional view of the solid-state image sensor 100 according to embodiments of the present disclosure.

The pixel array 10 has a plurality of solid-state image sensors 100 two-dimensionally arranged in a matrix (in columns and rows) on the semiconductor substrate 500. As used herein, "solid-state image sensor 100" refers to a solid-state image sensor (unit pixel) considered as a unit that detects light of colors and outputs one result for each color every time it outputs a detection result. Each solid-state image sensor 100 includes a plurality of photoelectric conversion elements (photodiodes (PD)) (photoelectric converters) (for example, as illustrated in FIG. 4, the solid-state image sensor 100 can include stacked three PDs 200, 300, and 400) capable of generating charge in accordance with the quantity of incident light of each color and a plurality of pixel transistors (for example, metal-oxide-semiconductor (MOS) transistors) (not illustrated). More specifically, the pixel transistors can include, for example, a transfer transistor, a select transistor, a reset transistor, and an amplifier transistor.

The solid-state image sensor 100 described above may be configured as a common pixel structure. This common pixel structure is constituted with a plurality of the PDs, a plurality of the transfer transistors, one floating diffusion (floating diffusion region) (charge accumulator) shared among the PDs for accumulating charge generated in the PDs, and other pixel transistors each shared among the PDs. That is, in the common pixel structure, a plurality of photoelectric conversion pairs configured with a PD and a transfer transistor are provided, and each photoelectric conversion pair shares other pixel transistors (select transistor, reset transistor, amplifier transistor, and the like). The detail of the circuit (connection configuration) of these pixel transistors will be described later.

(Vertical Drive Circuit 32)

The vertical drive circuit 32 is formed with, for example, a shift register, selects pixel drive wiring 42, supplies a pulse for driving the solid-state image sensors 100 to the selected pixel drive wiring 42, and drives the solid-state image sensors 100 in units of rows. That is, the vertical drive circuit 32 selectively scans the solid-state image sensors 100 in the pixel array 10 in units of rows sequentially in the vertical direction (the top-down direction in FIG. 1) and supplies a pixel signal based on the charge generated in accordance with the quantity of received light of the PD in each solid-state image sensor 100, to the column signal processing circuit 34 through a vertical signal line 44.

(Column Signal Processing Circuit 34)

The column signal processing circuit 34 is arranged for each column of the solid-state image sensors 100 and performs signal processing such as noise removal for each pixel column for pixel signals output from the solid-state image sensors 100 of one column. For example, the column signal processing circuit 34 performs signal processing such as correlated double sampling (CDS) and analog-digital (AD) conversion for removing fixed pattern noise unique to pixels.

(Horizontal Drive Circuit 36)

The horizontal drive circuit 36 is formed, for example, with a shift register, sequentially outputs a horizontal scan pulse to select each of the column signal processing circuits 34 in order, and allows each of the column signal processing circuits 34 to output a pixel signal to a horizontal signal line 46.

(Output Circuit 38)

The output circuit 38 can perform signal processing on a pixel signal sequentially supplied from each of the column signal processing circuits 34 through the horizontal signal line 46, and output the processed signal. The output circuit 38 may function, for example, as a function unit that performs buffering or may perform processing such as black level adjustment, column variation correction, and a variety of digital signal processing. Buffering refers to temporarily storing a pixel signal in order to compensate for differences in processing speed and transfer speed in exchanging pixel signals. An input/output terminal 48 is a terminal for exchanging signals with an external device.

(Control Circuit 40)

The control circuit 40 can receive an input clock and data indicating an operation mode and can output data such as internal information of the solid-state image sensors 100. That is, the control circuit 40 generates a control signal and a clock signal serving as a reference of operation for the vertical drive circuit 32, the column signal processing circuits 34, the horizontal drive circuit 36, and the like, based on a vertical sync signal, a horizontal sync signal, and a master clock. The control circuit 40 then outputs the generated clock signal and control signal to the vertical drive circuit 32, the column signal processing circuits 34, the horizontal drive circuit 36, and the like.

As described above, the solid-state imaging device 1 described above is a CMOS image sensor called a column AD type in which the column signal processing circuit 34 performing CDS processing and AD conversion processing is arranged for each pixel column. The planar configuration example of the solid-state imaging device 1 according to the present embodiment is not limited to the example illustrated in FIG. 1 and, for example, may include other circuits.

2. Equivalent Circuit of Solid-State Image Sensor 100

Figure 2:
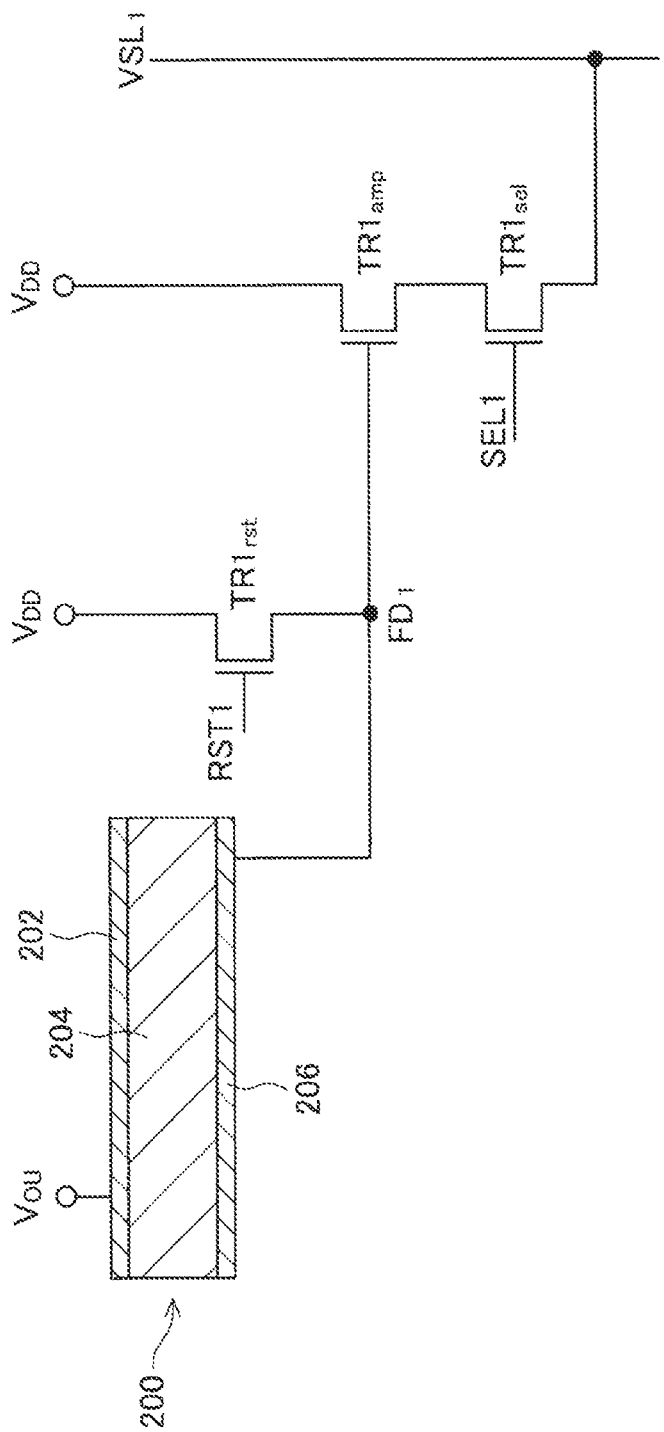
FIG. 2 is an equivalent circuit diagram of a PD 200 included in a solid-state image sensor 100 according to embodiments of the present disclosure.
Figure 3:
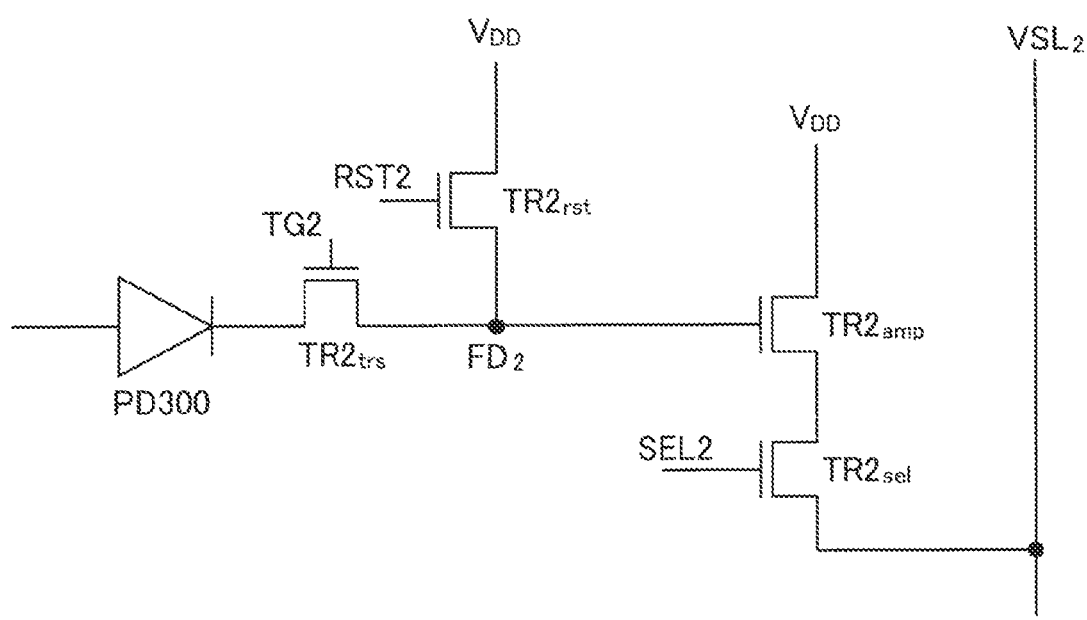
FIG. 3 is an equivalent circuit diagram of a PD 300 included in the solid-state image sensor 100 according to embodiments of the present disclosure.

The overall configuration of the solid-state imaging device 1 according to the present embodiment has been described above. An equivalent circuit of the PDs 200, 300, and 400 included in the solid-state image sensor 100 according to embodiments of the present disclosure will now be described with reference to FIG. 2 and FIG. 3. FIG. 2 is an equivalent circuit diagram of the PD 200 included in the solid-state image sensor 100 according to the present embodiment, and FIG. 3 is an equivalent circuit diagram of the PD 300 included in the solid-state image sensor 100 according to the present embodiment.

As schematically illustrated in the upper left in FIG. 2, the stack structure of the PD 200, which will be detailed later, is a stack structure including an upper electrode (common electrode) 202, a lower electrode (readout electrode) 206, and a photoelectric conversion film 204 sandwiched between the upper electrode 202 and the lower electrode 206, which are stacked above the semiconductor substrate 500 that is a silicon substrate.

As illustrated in FIG. 2, the upper electrode 202 is electrically connected to a select line $V_{OU}$ that selects a column to output a pixel signal. The lower electrode 206 is electrically connected through wiring or the like to one of the drain and source of a reset transistor $TR1_{rst}$ for resetting the accumulated charge. The gate of the reset transistor $TR1_{rst}$ is electrically connected to a reset signal line RST1 and further electrically connected to the vertical drive circuit 32 described above. The other of the drain and source of the reset transistor $TR1_{rst}$ (the side not connected to the lower electrode 206) is electrically connected to a power supply circuit $V_{DD}$.

The lower electrode 206 is electrically connected through wiring to the gate of an amplifier transistor $TR1_{amp}$ that converts charge to a voltage and outputs the voltage as a pixel signal. A node $FD_1$ connecting the lower electrode 206, the gate of the amplifier transistor $TR1_{amp}$, and one of the drain and source of the reset transistor $TR1_{rst}$ forms a part of the reset transistor $TR1_{rst}$. Charge from the lower electrode 206 changes the potential on the node $FD_1$ and is converted to a voltage by the amplifier transistor $TR1_{amp}$. One of the source and drain of the amplifier transistor $TR1_{amp}$ is electrically connected through wiring to one of the source and drain of the select transistor $TR1_{sel}$ outputting the pixel signal obtained through conversion to a signal line VSL1 in accordance with a select signal. The other (the side not connected to the select transistor $TR1_{sel}$) of the source and drain of the amplifier transistor $TR1_{amp}$ is electrically connected to the power supply circuit $V_{DD}$.

The other (the side not connected to the amplifier transistor $TR1_{amp}$) of the source and drain of the select transistor $TR1_{sel}$ is electrically connected to the signal line VSL1 that transmits the converted voltage as a pixel signal, and is further electrically connected to the column signal processing circuit 34 described above. The gate of the select transistor $TR1_{sel}$ is electrically connected to the select line SEL1 that selects a row to output a pixel signal, and is further electrically connected to the vertical drive circuit 32 described above.

An equivalent circuit of the PD 300 provided in the semiconductor substrate 500 will now be described with reference to FIG. 3. As illustrated in FIG. 3, the PD 300 provided in the semiconductor substrate 500 is electrically connected through wiring to pixel transistors (an amplifier transistor $TR2_{amp}$, a transfer transistor $TR2_{trs}$, a reset transistor $TR2_{rst}$, a select transistor $TR2_{sel}$) provided in the semiconductor substrate 500. Specifically, one side of the PD 300 is electrically connected through wiring to one of the source and drain of the transfer transistor $TR2_{trs}$ that transfers charge. The other (the side not connected to the PD 300) of the source and drain of the transfer transistor $TR2_{trs}$ is electrically connected through wiring to one of the source and drain of the reset transistor $TR2_{rst}$. The gate of the transfer transistor $TR2_{trs}$ is electrically connected to a transfer gate line TG2 and is further connected to the vertical drive circuit 32 described above. The other (the side not connected to the transfer transistor $TR2_{trs}$) of the source and drain of the reset transistor $TR2_{rst}$ is electrically connected to the power supply circuit $V_{DD}$. The gate of the reset transistor $TR2_{rst}$ is electrically connected to a reset line RST2 and is further connected to the vertical drive circuit 32 described above.

The other (the side not connected to the PD 300) of the source and drain of the transfer transistor $TR2_{trs}$ is also electrically connected through wiring to the gate of the amplifier transistor $TR2_{amp}$ that amplifies (converts) charge and outputs as a pixel signal. One of the source and drain of the amplifier transistor $TR2_{amp}$ is electrically connected through wiring to one of the source and drain of the select transistor $TR2_{sel}$ that outputs the pixel signal to the signal line VSL2 in accordance with a select signal. The other (the side not connected to the select transistor $TR2_{sel}$) of the source and drain of the amplifier transistor $TR2_{amp}$ is electrically connected to the power supply circuit $V_{DD}$. The other (the side not connected to the amplifier transistor $TR2_{amp}$) of the source and drain of the select transistor $TR2_{sel}$ is electrically connected to the signal line VSL2 and is further electrically connected to the column signal processing circuit 34 described above. The gate of the select transistor $TR2_{sel}$ is electrically connected to the select line SEL2 and is further electrically connected to the vertical drive circuit 32 described above.

Similar to the PD 300, the PD 400 provided in the semiconductor substrate 500 can also be represented similarly to the equivalent circuit in FIG. 3, and a description of an equivalent circuit of the PD 400 is omitted here.

3. Stack Structure of Solid-State Image Sensor 100

The equivalent circuit of the PDs 200, 300, and 400 included in the solid-state image sensor 100 according to the present embodiment has been described above. Referring now to FIG. 4, the stack structure of the solid-state image sensor 100 according to embodiments of the present disclosure will be described. FIG. 4 is a cross-sectional view of the solid-state image sensor 100 according to the present embodiment, specifically a cross-sectional view of the solid-state image sensor 100 cut along the through direction of the through electrode 600. In FIG. 4, the solid-state image sensor 100 is illustrated such that an incident surface on which light enters the solid-state image sensor 100 faces up. In the following description, the stack structure in the solid-state image sensor 100 will be described in order from the semiconductor substrate 500 positioned on the lower side of the solid-state image sensor 100 toward the PD 200 positioned above the semiconductor substrate 500.

First, as illustrated in FIG. 4, in the solid-state image sensor 100 according to the present embodiment, for example, in a semiconductor region 502 having a first conductivity type (for example, P-type) of the semiconductor substrate 500 made of silicon, two semiconductor regions 510 and 512 having a second conductivity type (for example, N-type) are formed in an overlapped manner in the thickness direction (depth direction) of the semiconductor substrate 500. The thus formed semiconductor regions 510 and 512 form a PN junction to serve as stacked two PDs 300 and 400. For example, the PD 300 having the semiconductor region 510 as a charge accumulation region is a photoelectric conversion element that absorbs blue light (for example, wavelengths of 450 nm to 495 nm) to generate charge (photoelectric conversion), and the PD 400 having the semiconductor region 512 as a charge accumulation region is a photoelectric conversion element that absorbs red light (for example, wavelengths of 620 nm to 750 nm) to generate charge.

A wiring layer 520 is provided on the surface (the lower side in FIG. 4) on the side opposite to the incident surface of the semiconductor substrate 500 on which the PD 200 and the like are stacked. The wiring layer 520 includes gate electrodes 524 of a plurality of pixel transistors for reading the charge accumulated in the PDs 200, 300, and 400, a plurality of wiring 522, and an interlayer insulating film 530. For example, the gate electrodes 524 and the wiring 522 can be formed of a material such as tungsten (W), aluminum (Al), and copper (Cu). The interlayer insulating film 530 can be formed of, for example, silicon oxide ($SiO_2$) or silicon nitride (SiN).

The semiconductor substrate 500 has the through electrode 600 that passes through the semiconductor substrate 500 to extract the charge generated by photoelectric conversion in the PD 200 described later to a floating diffusion 514 described later. Specifically, a conductor 602 serving as the center axis of the through electrode 600 can be formed of, for example, a doped silicon material such as phosphorus doped amorphous silicon (PDAS) or a metal material such as aluminum, tungsten, titanium (Ti), cobalt (Co), hafnium (Hf), and tantalum (Ta). On the outer periphery of the conductor 602, an insulating film 604 made of $SiO_2$ or SiN is formed for suppressing short-circuiting to the semiconductor region 502. In the present embodiment, a barrier metal film (not illustrated) may be provided between the conductor 602 and the insulating film 604 surrounding the outer periphery of the conductor 602. The barrier metal film can be formed from a material such as titanium nitride (TiN), tungsten nitride (WN), Ti, tantalum nitride (TaN), and Ta.

The through electrode 600 may be connected to a floating diffusion 514 provided in a semiconductor region having the second conductivity type (for example, N-type) provided in the semiconductor substrate 500, through the wiring 522 provided in the wiring layer 520. That is, the through electrode 600 can electrically connect the PD 200 (specifically, lower electrode 206) to the floating diffusion 514. The floating diffusion 514 can temporarily accumulate the charge generated by photoelectric conversion in the PD 200, through the through electrode 600.

As previously described, the wiring layer 520 has a plurality of gate electrodes 524 as the gate electrodes of a plurality of pixel transistors that read out the charge generated in the above-noted PD 200. Specifically, an electrode 524 is provided to face the semiconductor region 502 having the first conductivity type (for example, P-type) in the semiconductor substrate 500 with an insulating film 540 interposed therebetween. In the semiconductor substrate 500, semiconductor regions 516 having the second conductivity type (for example, N-type) are further provided so as to sandwich the semiconductor region 502 having the first conductivity type. The semiconductor regions 516 function as the source and drain regions of the pixel transistor. The above-noted through electrode 600 can electrically connect the PD 200 (specifically, lower electrode 206) to these pixel transistors. The detailed configuration of the through electrode 600 will be described later.

A fixed charge film 550 having negative fixed charge may be formed on the incident surface of the semiconductor substrate 500. The fixed charge film 550 may be formed from, for example, hafnium oxide ($HfO_2$), aluminum oxide ($Al_2O_3$), zirconium oxide (ZrO), tantalum oxide ($Ta_2O_5$), titanium oxide ($TiO_2$), lanthanum oxide ($La_2O_3$), praseodymium oxide ($Pr_6O_{11}$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), aluminum nitride (AlN), hafnium oxynitride (HfON), aluminum oxynitride (AlON), and the like. The fixed charge film 550 may be a stack film made of different materials described above in combination.

An insulating film 552 is provided on the fixed charge film 550. The insulating film 552 can be formed of, for example, a dielectric film having insulating properties, such as $SiO_2$, tetraethyl orthosilicate (TEOS), silicon nitride ($Si_3N_4$), and silicon oxynitride (SiON).

On the insulating film 552, the stack structure of the photoelectric conversion film 204 sandwiched between the upper electrode 202 and the lower electrode 206 is provided with an insulating film 560 interposed therebetween. The upper electrode 202, the photoelectric conversion film 204, and the lower electrode 206 constitute the PD 200 that converts light to charge. The PD 200 is, for example, a photoelectric conversion element that absorbs green light (for example, wavelengths of 495 nm to 570 nm) to generate charge (photoelectric conversion). The upper electrode 202 and the lower electrode 206 can be formed of, for example, a transparent conductive film such as indium tin oxide (ITO) and indium zinc oxide (IZO). Specifically, the upper electrode 202 is shared (in common) between adjacent pixels (solid-state image sensors 100), whereas the lower electrode 206 is formed individually for each of the pixels. The lower electrode 206 is electrically connected to the above-noted through electrode 600 by metal wiring 570 passing through the insulating film 560. The metal wiring 570 can be formed of, for example, a metal material such as W, Al, and Cu. The insulating film 560 can be formed of, for example, an insulating material that allows light to pass through, such as $Al_2O_3$, $SiO_2$, $Si_3N_4$, and SiON.

As illustrated in FIG. 4, a high-refractive index layer 580 made of an inorganic film such as $Si_3N_4$, SiON, and silicon carbide (SiC) and a planarization film 582 are formed on the upper electrode 202. An on-chip lens 590 is provided on the planarization film 582. The on-chip lens 590 can be formed of, for example, $Si_3N_4$ or a resin-based material such as styrene resin, acrylic resin, styrene-acrylic copolymer resin, or siloxane resin.

As described above, the solid-state image sensor 100 according to the present embodiment has a stack structure in which the PDs 200, 300, and 400 respectively corresponding to three colors are stacked. That is, the solid-state image sensor 100 described above is a vertical spectral type solid-state image sensor that converts green light to electricity at above the semiconductor substrate 500, that is, in the photoelectric conversion film 204 (PD 200) formed on the incident surface side of the semiconductor substrate 500, and converts blue and red light to electricity in the PDs 300 and 400 in the semiconductor substrate 500. It can be said that the solid-state image sensor 100 according to the present embodiment is a back-illuminated CMOS solid-state image sensor having pixel transistors formed on the side opposite to the incident surface side.

The above-noted photoelectric conversion film 204 can be formed from an organic material (organic photoelectric conversion film) or an inorganic material (inorganic photoelectric conversion film). For example, when the photoelectric conversion film 204 is formed from an organic material, any one of the following four modes can be selected: (a) a P-type organic semiconductor material; (b) an N-type organic semiconductor material; (c) a stack structure of at least two of a P-type organic semiconductor material layer, an N-type organic semiconductor material layer, and a mixed layer of a P-type organic semiconductor material and an N-type organic semiconductor material (bulk hetero structure); and (d) a mixed layer of a P-type organic semiconductor material and an N-type organic semiconductor material.

Specifically, examples of the P-type organic semiconductor material include naphthalene derivatives, anthracene derivatives, phenanthrene derivatives, pyrene derivatives, perylene derivatives, tetracene derivatives, pentacene derivatives, quinacridone derivatives, thiophene derivatives, thienothiophene derivatives, benzothiophene derivatives, benzothienobenzothiophene derivatives, triallylamine derivatives, carbazole derivatives, perylene derivatives, picene derivatives, chrysene derivatives, fluoranthene derivatives, phthalocyanine derivatives, subphthalocyanine derivatives, subporphyrazine derivatives, metal complexes having heterocyclic compounds as ligands, polythiophene derivatives, polybenzothiadiazole derivatives, and polyfluorene derivatives.

Examples of the N-type organic semiconductor material include fullerenes and fullerene derivatives <for example, fullerenes such as C60, C70, and C74 (higher fullerenes), endohedral fullerenes, and the like, or fullerene derivatives (for example, fullerene fluorides, phenyl-$C_{61}$-butyric acid methyl ester (PCBM) fullerene compounds, fullerene polymers, and the like)>, organic semiconductors having a highest occupied molecular orbital (HOMO) and a lowest unoccupied molecular orbital (LUMO) deeper than those of P-type organic semiconductors, and transparent inorganic metal oxides. More specifically, examples of the N-type organic semiconductor material include heterocyclic compounds containing nitrogen atom, oxygen atom, and sulfur atom, for example, organic molecules, organic metal complexes, and subphthalocyanine derivatives, having, in a part of molecular skeleton, a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylene vinylene derivative, a polybenzothiadiazole derivative, a polyfluorene derivative, or the like. Examples of the group included in the fullerene derivatives include branched or cyclic alkyl group or phenyl group; group having a linear or fused aromatic compound; group having a halide; partial fluoroalkyl group; perfluoroalkyl group; silylalkyl group; silylalkoxy group; arylsilyl group; arylsulfanil group; alkylsulfanil group; arylsulfonyl group; alkylsulfonyl group; arylsulfide group; alkylsulfide group; amino group; alkylamino group; arylamino group; hydroxy group; alkoxy group; acylamino group; acyloxy group; carbonyl group; carboxy group; carboxamido group; carboalkoxy group; acyl group; sulfonyl group; cyano group; nitro group; group having a chalcogenide; phosphino group; phosphono group; and derivatives thereof. The film thickness of the photoelectric conversion film 204 formed from an organic material may be, for example, but not limited to, $1 \times 10^{-8}$ m to $5 \times 10^{-7}$ m, preferably $2.5 \times 10^{-8}$ m to $3 \times 10^{-7}$ m, more preferably from $2.5 \times 10^{-8}$ m to $2 \times 10^{-7}$ m. In the foregoing description, the organic semiconductor materials are classified into P-type and N-type. As used herein, the P-type means that holes are easily transported, and the N-type means that electrons are easily transported. That is, the organic semiconductor materials are not necessarily interpreted as having holes or electrons as thermally excited major carriers, like inorganic semiconductor materials.

More specifically, in order to function as the photoelectric conversion film 204 of the PD 200 that receives green light and converts light into electricity, the photoelectric conversion film 204 can contain, for example, a rhodamine-based pigment, a merocyanine-based pigment, a quinacridone derivative, a subphthalocyanine-based pigment (subphthalocyanine derivative), and the like.

When the photoelectric conversion film 204 is formed from an inorganic material, examples of the inorganic semiconductor material include crystalline silicon, amorphous silicon, microcrystalline silicon, crystalline selenium, amorphous selenium, and chalcopyrite-based compounds such as CIGS (CuInGaSe), CIS ($CuInSe_2$), $CuInS_2$, $CuAlS_2$, $CuAlSe_2$, $CuGaS_2$, $CuGaSe_2$, $AgAlS_2$, $AgAlSe_2$, $AgInS_2$, $AgInSe_2$, or III-V group compounds such as GaAs, InP, AlGaAs, InGaP, AlGaInP, and InGaAsP, and compound semiconductors such as CdSe, CdS, $In_2Se_3$, $In_2S_3$, $Bi_2Se_3$, $Bi_2S_3$, ZnSe, ZnS, PbSe, and PbS. In addition, quantum dots made of the above-noted materials may be used as the photoelectric conversion film 204.

In the present embodiment, the solid-state image sensor 100 described above is not limited to the structure of a stack of the PD 200 having the photoelectric conversion film 204 provided above the semiconductor substrate 500 and the PDs 300 and 400 provided in the semiconductor substrate 500. For example, in the present embodiment, the solid-state image sensor 100 may be a stack structure including the PD 200 having the photoelectric conversion film 204 provided above the semiconductor substrate 500 and the PD 300 provided in the semiconductor substrate 500, that is, a stack structure of two PDs 200 and 300. In the present embodiment, the solid-state image sensor 100 may be a structure having two or three PDs 200 stacked above the semiconductor substrate 500. In such a case, the PDs 200 may have respective photoelectric conversion films 204, and the photoelectric conversion films 204 may be formed of an organic semiconductor material or may be formed of an inorganic semiconductor material. In this case, in order to function as the photoelectric conversion film 204 of the PD 200 that receives blue light and converts the light into electricity, the photoelectric conversion film 204 may contain, for example, a coumaric acid pigment, tris-(8-hydroxyquinoline)aluminum ($Alq_3$), a merocyanine-based pigment, or the like. In order to function as the photoelectric conversion film 204 of the PD 200 that receives red light and converts the light into electricity, the photoelectric conversion film 204 may contain a phthalocyanine-based pigment, a subphthalocyanine-based pigment (subphthalocyanine derivative), or the like.

4. Circumstances Leading to Making of the Present Invention

Figure 5:
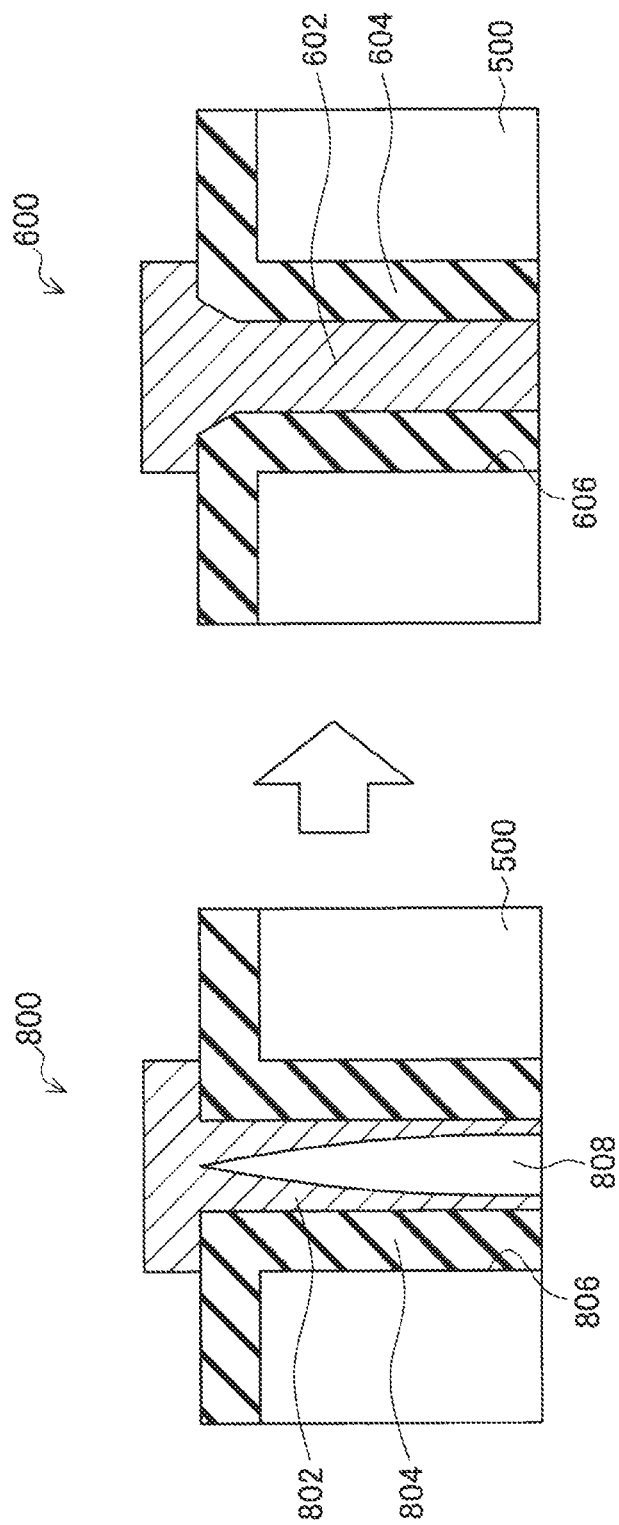
FIG. 5 is a diagram for explaining circumstances leading to creation of embodiments of the present disclosure.

Prior to a detailed description of embodiments according to the present disclosure, circumstances leading to embodiments of the present disclosure made by the inventors of the present invention will be described with reference to FIG. 5. FIG. 5 is a diagram for explaining circumstances leading to creation of embodiments of the present disclosure. Specifically, the left side of FIG. 5 schematically illustrates a cross section of a through electrode 800 according to a comparative example, and the right side of FIG. 5 schematically illustrates a cross section of the through electrode 600 according to embodiments of the present disclosure. As used herein, the comparison example means the through electrode 800 that had been studied before the inventors of the present invention made embodiments of the present disclosure.

The inventors have so far contemplated providing the through electrode 600 (800) for each solid-state image sensor (pixel) 100. In this case, in order to achieve satisfactory sensitivity of the solid-state image sensor 100, it is preferable to ensure a large light incident surface on which light enters, in other words, it is preferable to ensure a large area occupied by the PDs 300 and 400. When the through electrode 600 is provided for each solid-state image sensor 100, therefore, the through electrode 600 is preferably more minute (for example, with a smaller diameter) in order to ensure a large light incident surface on which light enters. According to studies by the inventors of the present invention, it is preferable that the diameter of the conductor 602

(802) of the through electrode 600 is, for example, about 100 nm. The inventors then fabricated the through electrode 800 of the comparative example that had such a configuration as the through electrode disclosed in Patent Literature 1 above with a small diameter as described above, and found that it was difficult to keep the resistance value of the through electrode 800 low.

Specifically, the inventors of the present invention had fabricated minute through electrodes 800 (comparative example) as follows before creating embodiments of the present disclosure. First, as illustrated in the left side of FIG. 5, a through hole 806 is formed to pass through the semiconductor substrate 500 substantially vertically to the semiconductor substrate 500. An insulating film 804 is further formed to cover the inner wall of the through hole 806. Subsequently, a conductor 802 is deposited to fill in the through hole 806 by chemical vapor deposition (CVD).

According to studies by the inventors of the present invention, when the conductor 802 is deposited to fill in the through hole 806, as illustrated in the left side of FIG. 5, a void 808 is produced in the through hole 806. Presumably, the void 808 is produced as follows. It is known that when a film is deposited by CVD, the film is deposited so as to conform to the shape of the substrate. It is also known that when a film is deposited by CVD to fill in the through hole 806, the film adheres to the inner wall of the through hole 806 more easily on its upper portion, and the film tends to be deposited more easily on the upper portion of the inner wall of the through hole 806 than on the lower portion of the inner wall. It is therefore assumed that when the conductor 802 is deposited to fill in the through hole 806, the conductor 802 in the form of an overhang extending from the upper portion of the inner wall of the through hole 806 tends to be formed. As the deposition of the conductor 802 proceeds, an additional overhang-shaped film of the conductor 802 is formed on the above-noted overhang-shaped film, and eventually, the deposited conductor 802 is shaped like a cap, which presumably causes the void 808 in the through hole 806. That is, in the comparative example, as illustrated in the left side of FIG. 5, although the upper portion of the through hole 806 is closed by the conductor 802, the void 808 remains in the inside of the through hole 806. In other words, the through hole 806 sometimes fails to be filled with the conductor 802. In this case, since the through hole 806 fails to be filled with the conductor 802, the resistance value of the through electrode 800 increases. According to studies by the inventors of the present invention, the phenomenon as described above occurs more conspicuously as the through electrode 800 is downsized and the aspect ratio of the through hole 806 is increased.

In view of such a situation, the inventors of the present invention have created embodiments of the present disclosure related to the through electrode 600 in which the through hole 606 can be filled with the conductor 602, by avoiding occurrence of the void 808 in the through hole 606 in order to keep the resistance value of the through electrode 600 low.

In the comparative example, as illustrated in the left side of FIG. 5, the cross-sectional area of the conductor 802 of the through electrode 800 in a cut section orthogonal to the through direction of the through electrode 600 is constant, and the conductor 802 is shaped like a cylinder. By contrast, in embodiments of the present disclosure, as illustrated in the right side of FIG. 5, at the upper portion (the end portion on the PD 200 side) of the through electrode 600, the cross-sectional area of the conductor 602 in a cut section orthogonal to the through direction of the through electrode 600 gradually increases upward along the through direction. That is, in the present embodiment, the upper portion of the conductor 602 has a tapered shape. More specifically, in the present embodiment, during fabrication of the through electrode 600 having the tapered conductor 602 as described above, the diameter of the upper portion of the through hole 606 with the inner wall covered with the insulating film 604 is increased, and the conductor 602 is deposited to fill in the through hole 606 having the diameter increased. According to the present embodiment, the diameter of the upper portion of the through hole 606 is increased to allow the conductor 602 to easily reach the bottom portion of the through hole 606, thereby improving the filling characteristic of the conductor 602 and avoiding occurrence of the void 808 in the through hole 606. As a result, according to the present embodiment, the resistance value of the through electrode 600 can be kept low. The detail of embodiments according to the present disclosure will be described in order below.

5. First Embodiment

<5.1 Detailed Configuration of Through Electrode 600>

Figure 6:
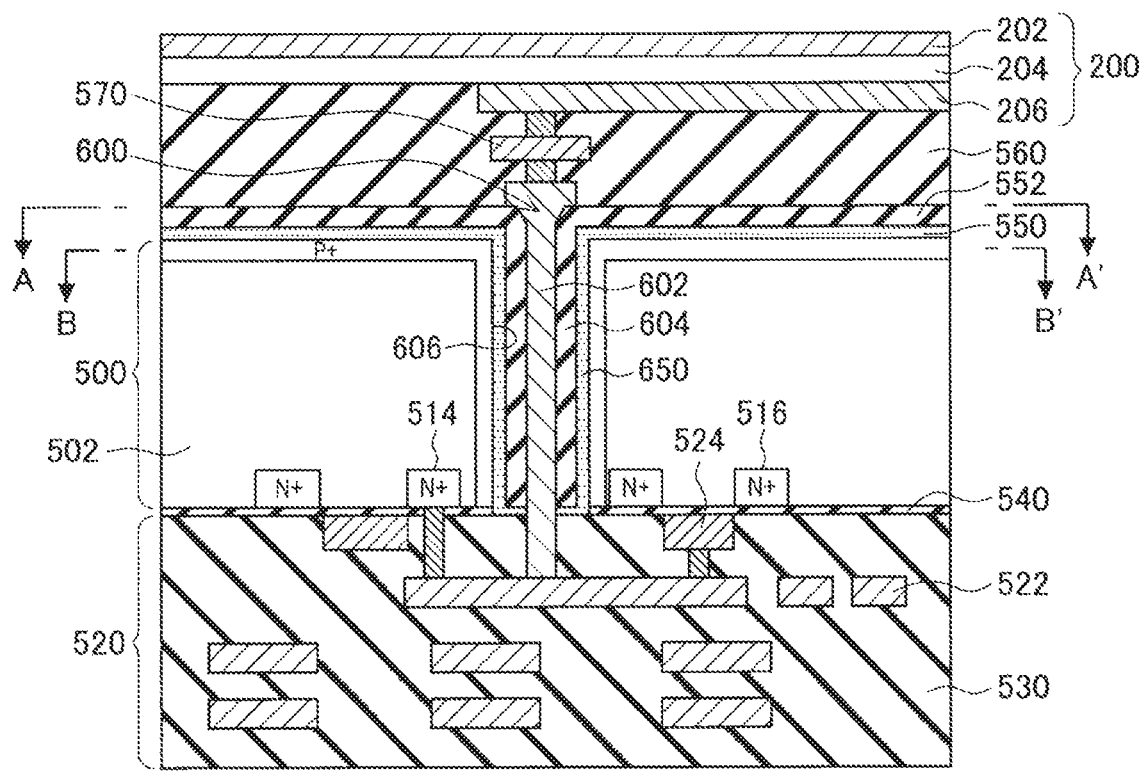
FIG. 6 is a partial enlarged view of a cross section of the solid-state image sensor 100 according to a first embodiment of the present disclosure.
Figure 7:
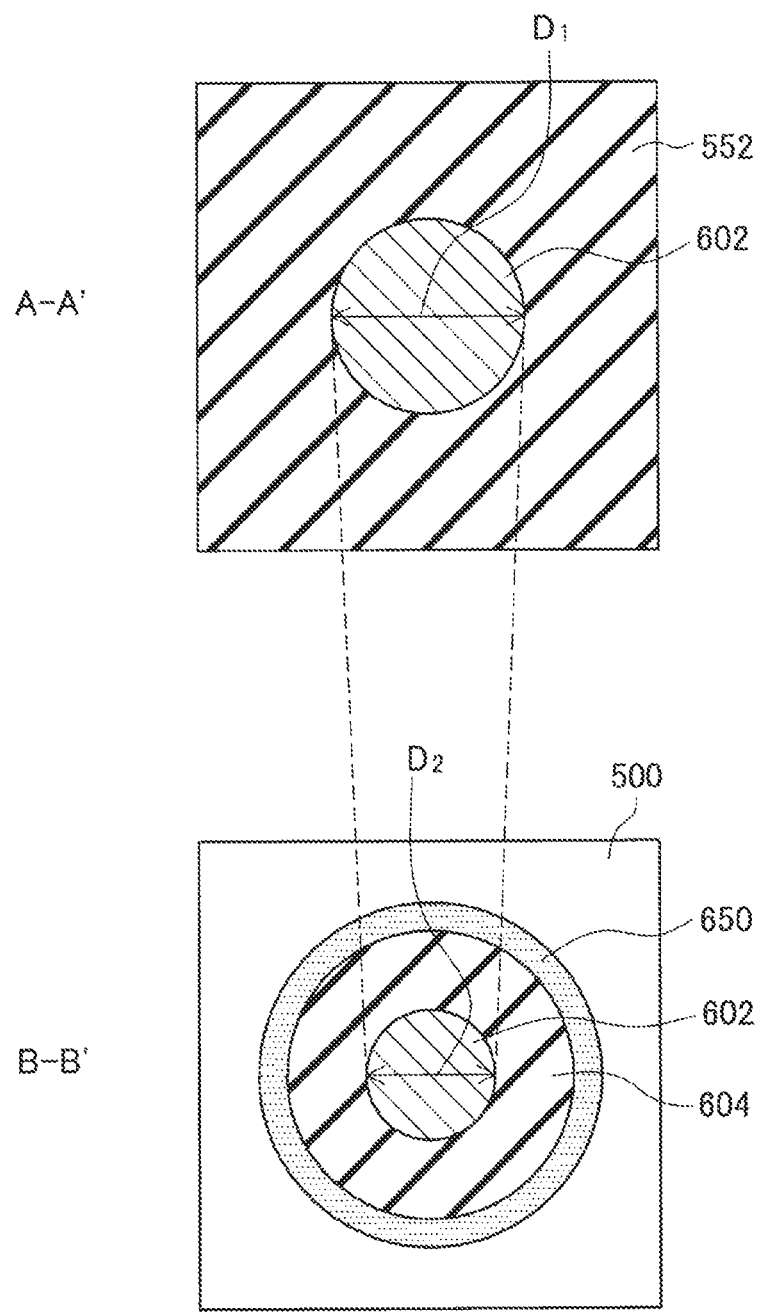
FIG. 7 is a cross-sectional view of a through electrode 600 cut along line A-A' and line B-B' in FIG. 6.
Figure 8:
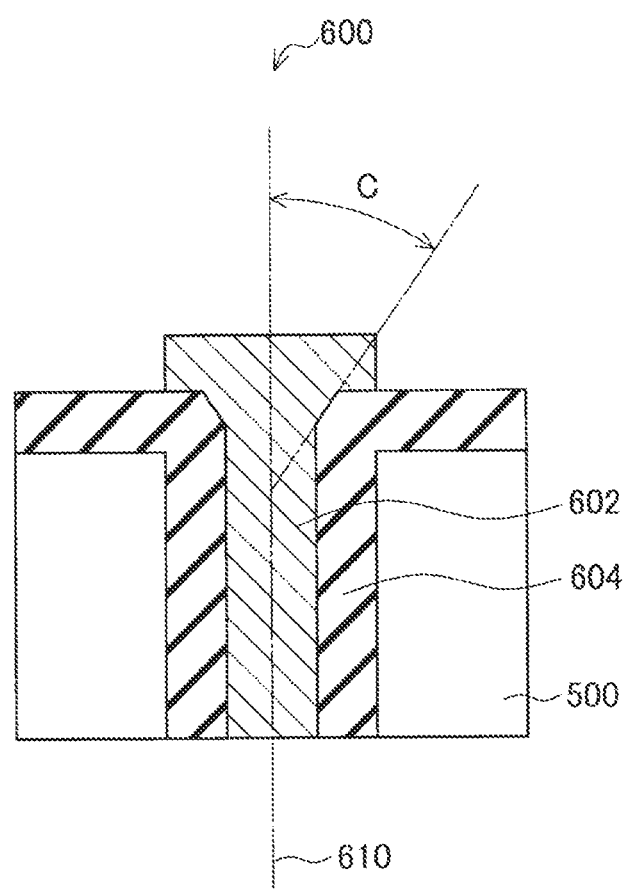
FIG. 8 is a diagram schematically illustrating an upper portion of the through electrode 600 according to the first embodiment of the present disclosure.

Referring first to FIG. 6 to FIG. 8, a detailed configuration of the through electrode 600 according to a first embodiment of the present disclosure is described. FIG. 6 is a partial enlarged view of a cross section (FIG. 4) of the solid-state image sensor 100 according to the present embodiment, specifically, an enlarged view of the through electrode 600 and the periphery of the through electrode 600. FIG. 7 is a cross-sectional view of the through electrode 600 cut along line A-A' and line B-B' in FIG. 6. Specifically, the upper part of FIG. 7 illustrates a cross-sectional view of the through electrode 600 cut along line A-A' in FIG. 6, and the lower part of FIG. 7 illustrates a cross-sectional view of the through electrode 600 cut along line B-B' in FIG. 6. FIG. 8 is a diagram illustrating the upper portion of the through electrode 600 according to the present embodiment, specifically, a partially enlarged view of a cross section of the through electrode 600 cut along the through direction of the through electrode 600. In FIG. 8, a fixed charge film 650 is not illustrated for ease of understanding.

As illustrated in FIG. 6, the through electrode 600 according to the present embodiment mainly includes a through hole 606 passing through the semiconductor substrate 500 substantially vertically to the semiconductor substrate 500 (in other words, passing through along the film thickness direction of the semiconductor substrate 500), the fixed charge film 650 covering the inner wall of the through hole 606, the insulating film 604 covering the inner wall with the fixed charge film 650 interposed therebetween, and the conductor 602 filling the through hole 606. As previously described, a barrier metal film (not illustrated) may be provided between the conductor 602 and the insulating film 604 surrounding the outer periphery of the conductor 602. The detail of the parts of the through electrode 600 will be described in order below.

In the present embodiment, the through hole 606 is, for example, a hole in the shape of a cylinder or a truncated cone having a taper, preferably a cylindrical or substantially cylindrical hole (in other words, a hole having an opening diameter substantially equal in the through direction). In the present embodiment, the through hole 606 is a substantially cylindrical hole so that the film thickness of the insulating film 604 covering the inner wall of the through hole 606 can be even more uniform. According to the present embodiment, therefore, while the insulation between the through electrode 600 (specifically, the conductor 602) and the semiconductor substrate 500 (specifically, the semiconductor region 502) is ensured, the parasitic capacitance of the through electrode 600 caused by the insulating film 604 can be reduced. As a result, since the parasitic capacitance can be reduced, the present embodiment can avoid unintentional transmittance of noise to the through electrode 600 through the parasitic capacitance and consequently can avoid deterioration in characteristics of the solid-state image sensor 100.

In the present embodiment, as previously described, the fixed charge film 650 is provided to cover the inner wall and the bottom surface (the lower surface) of the through hole 606. For example, the fixed charge film 650 can be formed of $HfO_2$, $Al_2O_3$, ZrO, $Ta_2O_5$, $TiO_2$, or the like, similarly to the fixed charge film 550 described above. The fixed charge film 650 may be a stack film of the aforementioned different materials in combination.

In the present embodiment, as previously described, the insulating film 604 is provided to cover the inner wall of the through hole 606 with the fixed charge film 650 interposed therebetween. The insulating film 604 is provided to cover the outer periphery of the conductor 602 described later. The insulating film 604 is an insulating film for suppressing short-circuiting to the semiconductor substrate 500 (specifically, the semiconductor region 502) and formed of $SiO_2$, SiN, or the like.

In the present embodiment, the conductor 602 is provided to fill in the through hole 606 having the inner wall covered with the fixed charge film 650 and the insulating film 604. In other words, as illustrated in FIG. 6, the conductor 602 is positioned at the center of the through electrode 600. Specifically, the conductor 602 is a substantially cylindrical electrode passing through the center portion of the through hole 606 and has a tapered shape at its upper portion (the end portion on the PD 200 side). The conductor 602 further passes through the bottom surface (the lower surface) of the through hole 606 to extend to the wiring 522 of the wiring layer 520. As previously described, the conductor 602 can be formed of, for example, a doped silicon material such as PDAS or a metal material such as Al, W, Ti, Co, Hf, and Ta.

More specifically, at the upper portion (the end portion on the PD 200 side) of the through electrode 600, the cross-sectional area of the conductor 602 in a cut section orthogonal to the through direction of the through electrode 600 gradually increases upward along the through direction. That is, in the present embodiment, the upper side of the conductor 602 has a tapered shape.

Further referring to FIG. 7, the conductor 602 will be described in more detail. The lower part of FIG. 7 illustrates a cut section when the through electrode 600 is cut through a plane (line B-B' in FIG. 6) orthogonal to the through direction of the through electrode 600, below the fixed charge film 550. The upper part of FIG. 7 illustrates a cut section when the through electrode 600 is cut through a plane (line A-A' in FIG. 6) orthogonal to the through direction of the through electrode 600, at the insulating film 552. As illustrated in the upper drawing and the lower drawing of FIG. 7, in the present embodiment, the conductor 602 has the diameter increasing upward. More specifically, in the present embodiment, the diameter of the conductor 602 in a cut section at the upper portion (the end portion on the PD 200 side) of the through electrode 600, in other words, the diameter $D_1$ (see the upper drawing in FIG. 7) of the conductor 602 when the through electrode 600 is cut along line A-A' in FIG. 6 is 1.2 times or more the diameter of the conductor 602 in a cut section at the lower portion (the end portion on the floating diffusion 514 side) of the through electrode 600, in other words, the diameter $D_2$ (see the lower drawing in FIG. 7) of the conductor 602 when the through electrode 600 is cut along line B-B' of FIG. 6.

In the present embodiment, when the through electrode 600 is cut along line B-B' in FIG. 6, the diameter $D_2$ (see the lower drawing in FIG. 7) of the conductor 602 is preferably 50 nm to 500 nm. In the present embodiment, when the through electrode 600 is cut along line A-A' in FIG. 6, the diameter $D_1$ (see the upper drawing in FIG. 7) of the conductor 602 is preferably 60 nm to 600 nm.

It is preferable that the upper surface (the surface on the PD 200 side) of the conductor 602 is large in order to ensure the contact with the metal wiring 570. However, with a large upper surface of the conductor 602, incidence of light on the PDs 300 and 400 positioned below relative to the upper surface of the conductor 602 is interrupted by the upper surface of the conductor 602. In the present embodiment, therefore, it is preferable that the upper surface of the conductor 602 is small to such an extent that the contact with the metal wiring 570 can be ensured. In the present embodiment, it is preferable that the upper surface of the conductor 602 is larger than the cut section of the conductor 602 (see the upper drawing in FIG. 7) when the through electrode 600 is cut along line A-A' in FIG. 6, and is smaller than the opening of the through hole 606 (specifically, the opening of the through hole 606 with the inner wall not covered with the fixed charge film 650 and the insulating film 604).

In the present embodiment, as illustrated in FIG. 8 illustrating a partially enlarged view of a cross section of the through electrode 600 cut along the through direction of the through electrode 600, at the upper portion (the end portion on the PD 200 side) of the through electrode 600, the gradient of the outer peripheral surface of the conductor 602 of the through electrode 600 preferably has an angle of 1° or more and 60° or less with respect to the center axis 610 of the conductor 602 extending in the through direction. In the present embodiment, it is preferable that the gradient is set to such a value that can ensure that the insulating film 604 has a film thickness capable of suppressing short-circuiting to the semiconductor substrate 500 (specifically, the semiconductor region 502) and also can ensure a large light incident surface on which light enters for the PDs 300 and 400.

In the present embodiment, as long as the conductor 602 has a tapered shape at the upper portion (the end portion on the PD 200 side) of the through electrode 600, the entire through hole 606 passing through the semiconductor substrate 500 (through the film thickness of the semiconductor substrate 500) may be tapered, and the taper shape is not limited.

In the present embodiment, when the through electrode 600 having the conductor 602 having the shape as described above is formed, which will be detailed later, the diameter at the upper portion of the through hole 606 with the inner wall covered with the insulating film 604 is increased, and the conductor 602 is deposited to fill in the through hole 606 having the diameter increased. According to the present embodiment, the diameter of the upper portion of the through hole 606 is increased to allow the conductor 602 to easily reach the bottom portion of the through hole 606, thereby improving the filling characteristic of the conductor 602 and avoiding occurrence of the void 808 in the through hole 606. As a result, according to the present embodiment, the resistance value of the through electrode 600 can be kept low.

<5.2 Method of Manufacturing Solid-State Image Sensor 100>

The detailed configuration of the through electrode 600 according to the present embodiment has been described above. A method of manufacturing the solid-state image sensor 100 including the through electrode 600 according to the present embodiment will now be described with reference to FIG. 9 to FIG. 13. FIG. 9 to FIG. 13 are diagrams for explaining the method of manufacturing the solid-state image sensor 100 according to the present embodiment and illustrating a cross section of the solid-state image sensor 100 in the steps of the manufacturing method, which corresponds to the cross-sectional view in FIG. 4.

Figure 9:
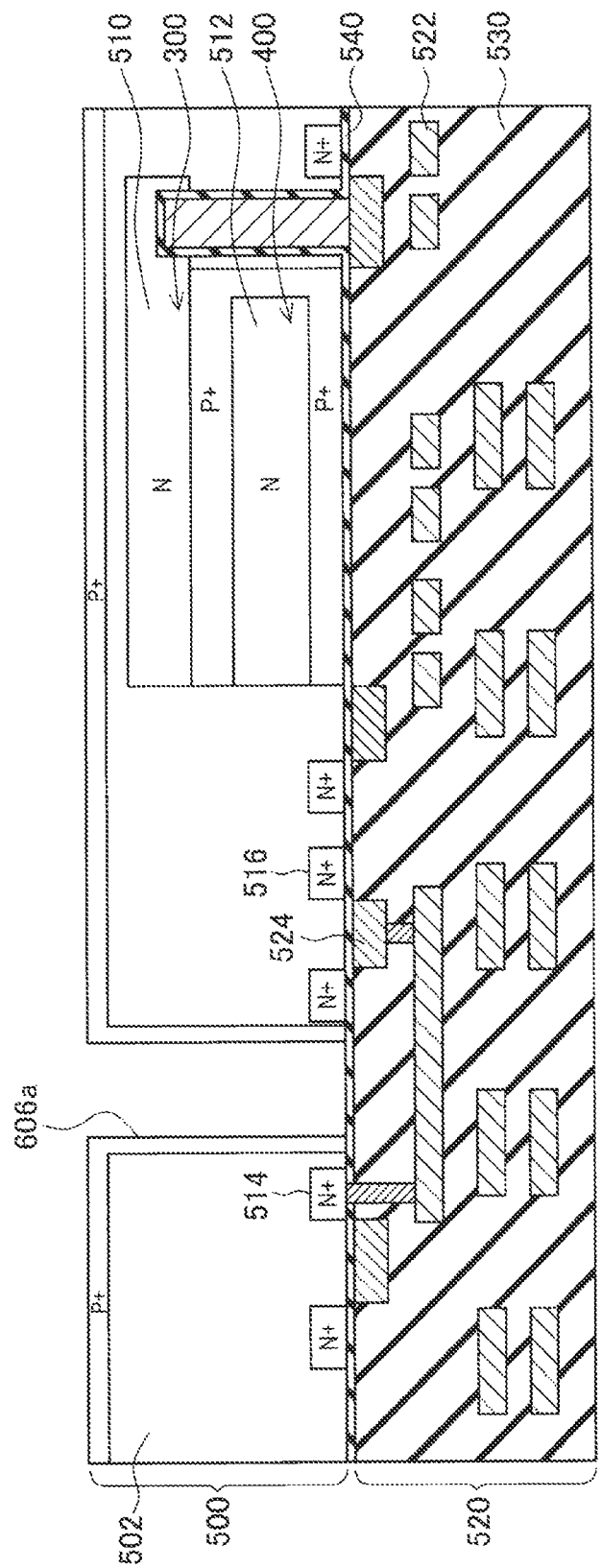
FIG. 9 is a diagram (1) for explaining a method of manufacturing the solid-state image sensor 100 according to the first embodiment of the present disclosure.

First, as illustrated in FIG. 9, the semiconductor substrate 500 is processed from the light incident surface side, for example, by dry etching to form a through hole 606*a* passing through the semiconductor substrate 500.

Figure 10:
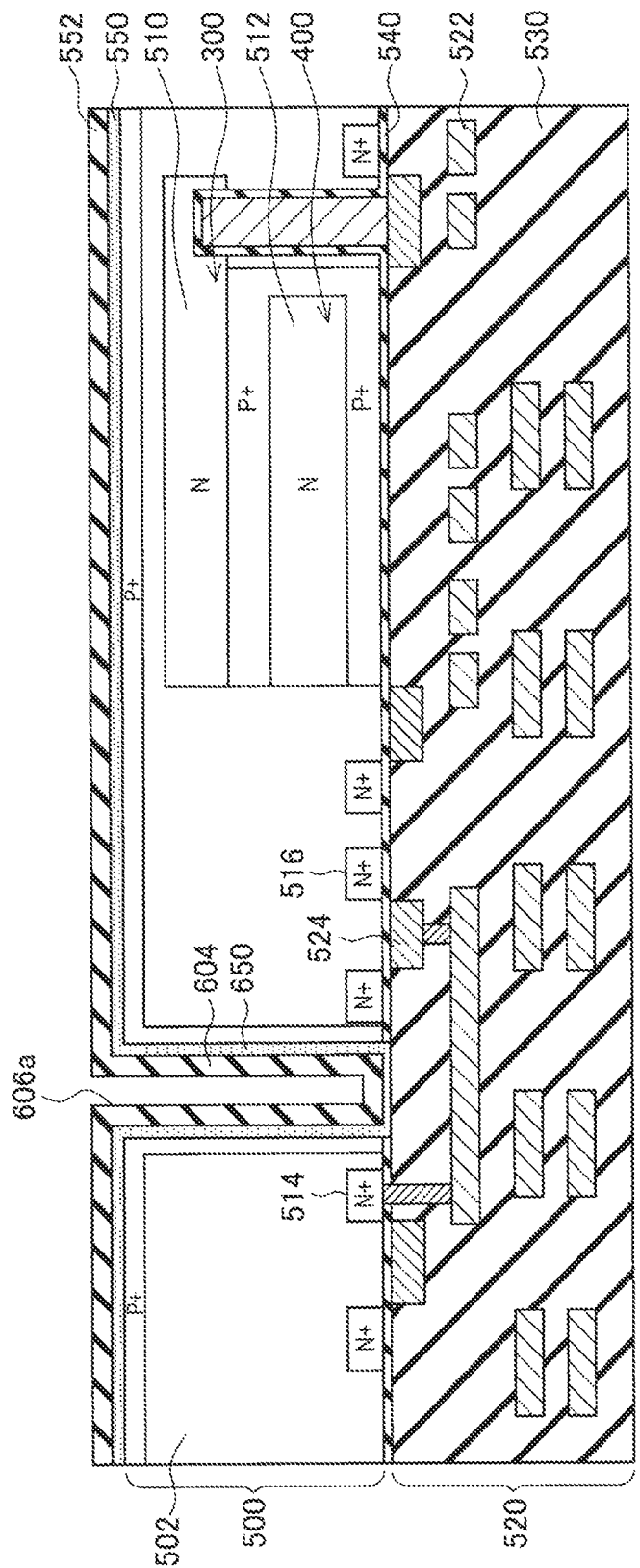
FIG. 10 is a diagram (2) for explaining the method of manufacturing the solid-state image sensor 100 according to the first embodiment of the present disclosure.

Subsequently, as illustrated in FIG. 10, fixed charge films 550 and 650 and insulating films 552 and 604 are deposited to cover the inner wall and the bottom surface of the through hole 606*a* and the incident surface of the semiconductor substrate 500.

Figure 11:
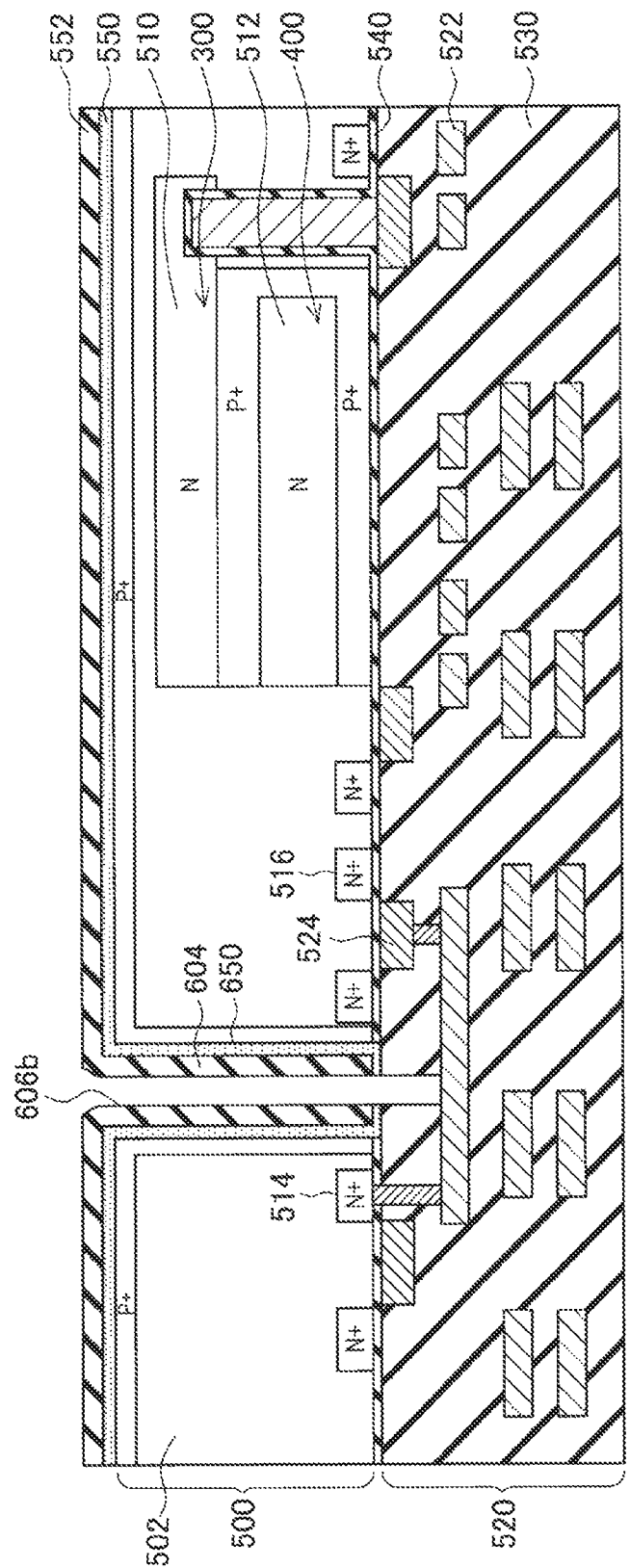
FIG. 11 is a diagram (3) for explaining the method of manufacturing the solid-state image sensor 100 according to the first embodiment of the present disclosure.

Then, as illustrated in FIG. 11, the fixed charge film 650 and the insulating films 552 and 604 are partially removed, for example, by dry etching to form a through hole 606*b* passing through the semiconductor substrate 500 and extending to the wiring 522. In doing so, the insulating films 552 and 604 formed on the periphery of the opening of the upper side of the through hole 606*b* are partially removed to increase the diameter of the opening on the upper side of the through hole 606*b*.

Figure 12:
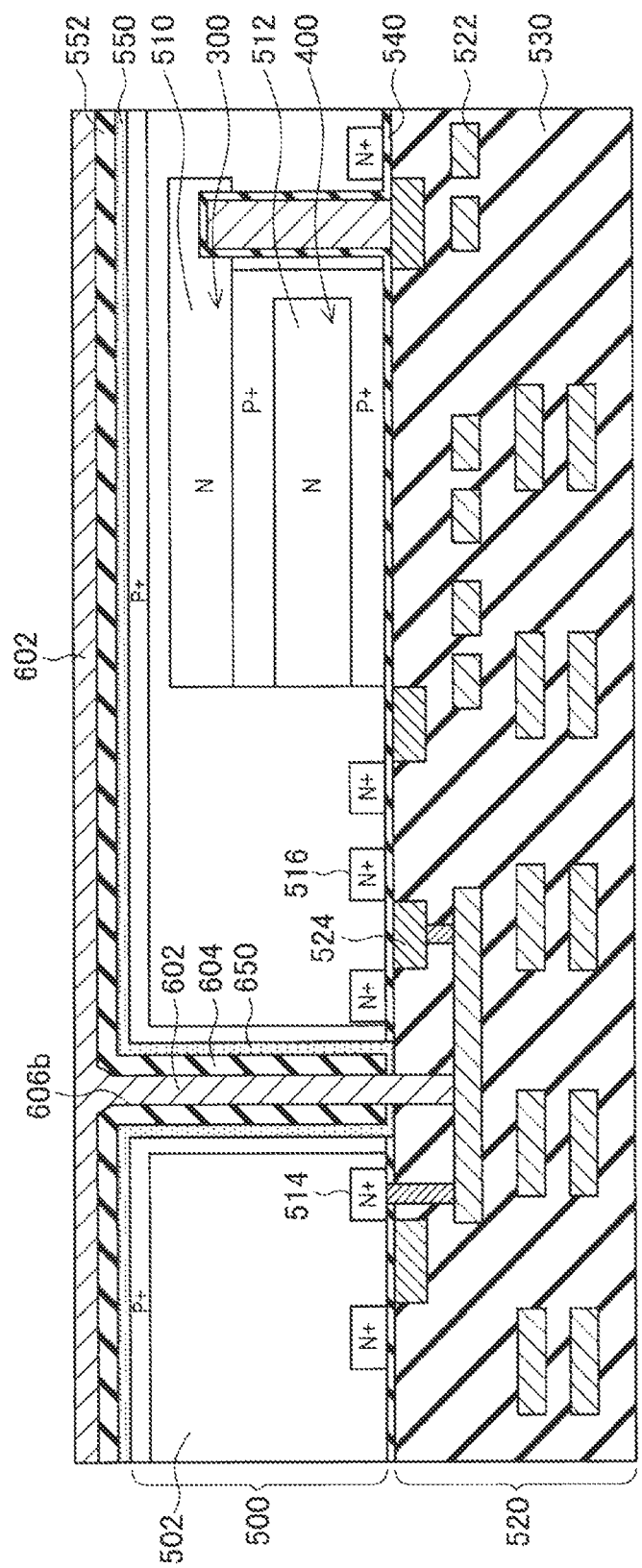
FIG. 12 is a diagram (4) for explaining the method of manufacturing the solid-state image sensor 100 according to the first embodiment of the present disclosure.

Subsequently, as illustrated in FIG. 12, the conductor 602 (metal film) is deposited to fill in the through hole 606*b*. In doing so, as will be described later, the conductor 602 may be depressed at the center of the through hole 606*b* when the through hole 606*b* is viewed from above.

Figure 13:
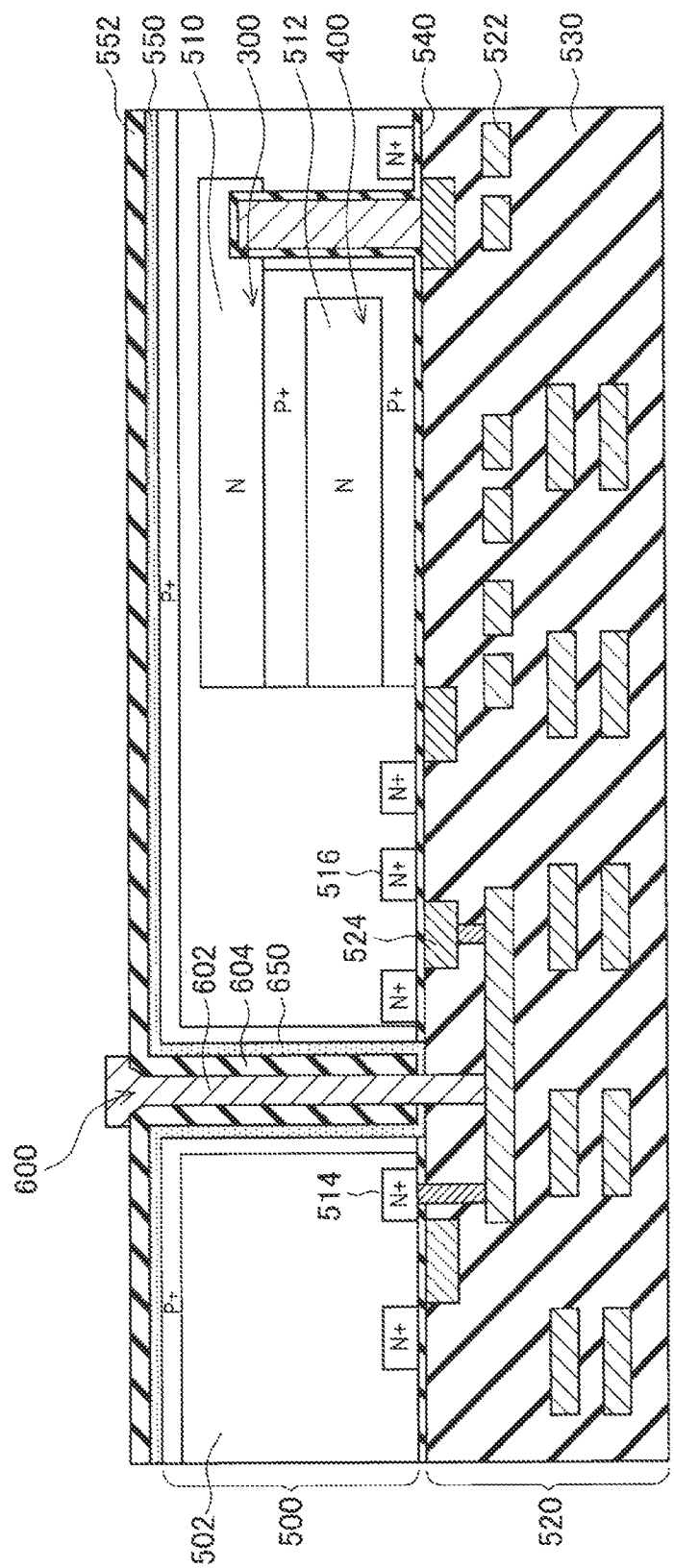
FIG. 13 is a diagram (5) for explaining the method of manufacturing the solid-state image sensor 100 according to the first embodiment of the present disclosure.

Then, as illustrated in FIG. 13, the conductor 602 is partially removed, for example, by dry etching to form the through electrode 600.

The metal wiring 570 and the insulating film 560 are further formed. Subsequently, the lower electrode 206, the photoelectric conversion film 204, the upper electrode 202, the high-refractive index layer 580, and the like are formed. Finally, the planarization film 582 and the on-chip lens 590 are formed. The solid-state image sensor 100 illustrated in FIG. 4 can be obtained as described above.

The solid-state image sensor 100 according to the present embodiment can be manufactured using methods, devices, and conditions used for manufacturing common semiconductor devices. That is, the solid-state image sensor 100 according to the present embodiment can be manufactured using the existing method of manufacturing a semiconductor device as follows.

Examples of the manufacturing method may include physical vapor deposition (PVD), chemical vapor deposition (CVD), and atomic layer deposition (ALD). Examples of PVD may include vacuum deposition, electron beam (EB) deposition, sputtering processes (magnetron sputtering, RF-DC coupled bias sputtering, electron cyclotron resonance (ECR) sputtering, facing target sputtering, high frequency sputtering, etc.), ion plating, laser ablation, molecular beam epitaxy (MBE), and laser transfer. Examples of CVD may include plasma CVD, thermal CVD, organic metal (MO) CVD, and photo-CVD. Examples of other methods may include electroplating, electroless plating, spin coating; dipping; casting; micro-contact printing; drop casting; printing processes such as screen printing, inkjet printing, offset printing, gravure printing, and flexographic printing; stamping; spraying; coating processes such as air doctor coater, blade coater, rod coater, knife coater, squeeze coater, reverse roll coater, transfer roll coater, gravure coater, kiss coater, cast coater, spray coater, slit orifice coater, and calender coater. Examples of patterning may include chemical etching such as shadow mask, laser transfer, and photolithography, and physical etching using ultraviolet rays, laser, and the like. In addition, examples of planarization techniques may include chemical mechanical polishing (CMP), laser planarization, and ref lowing.

As described above, in the present embodiment, during fabrication of the through electrode 600 having the conductor 602, the diameter of the upper portion of the through hole 606*a* with the inner wall covered with the insulating film 604 is increased, and the conductor 602 is deposited to fill in the through hole 606*b* having the diameter increased. According to the present embodiment, the diameter of the upper portion of the through hole 606*a* is increased to allow the conductor 602 to easily reach the bottom portion of the through hole 606*b*, thereby improving the filling characteristic of the conductor 602 and avoiding occurrence of the void 808 in the through hole 606*b*. As a result, according to the present embodiment, the resistance value of the through electrode 600 can be kept low.

<5.3 Modifications>

In the solid-state image sensor 100 according to the present embodiment, the upper portion (the end portion on the PD 200 side) of the conductor 602 may be electrically connected to wiring formed of a transparent conductor. In other words, in the present embodiment, the metal wiring 570 in FIG. 4 may be formed of a transparent conductor.

A method of manufacturing the solid-state image sensor 100 according to the present modification will be described below with reference to FIG. 13 described above. As illustrated in FIG. 13, the conductor 602 is partially removed, for example, by dry etching, and after the through electrode 600 is formed, a transparent conductor is deposited on the through electrode 600. The transparent conductor is partially removed, for example, by dry etching to form a wiring structure. The wiring 570 of the solid-state image sensor 100 according to the modification thus can be formed. The transparent conductor can be formed of a material such as ITO and IZO.

In the present modification, the metal wiring 570 is formed of a transparent conductor to prevent light incident on the wiring 570 from being reflected and unintentionally being incident on the PDs 200, 300, and 400, thereby reducing occurrence of color mixing or flare in the solid-state image sensor 100.

6. Second Embodiment

Figure 14:
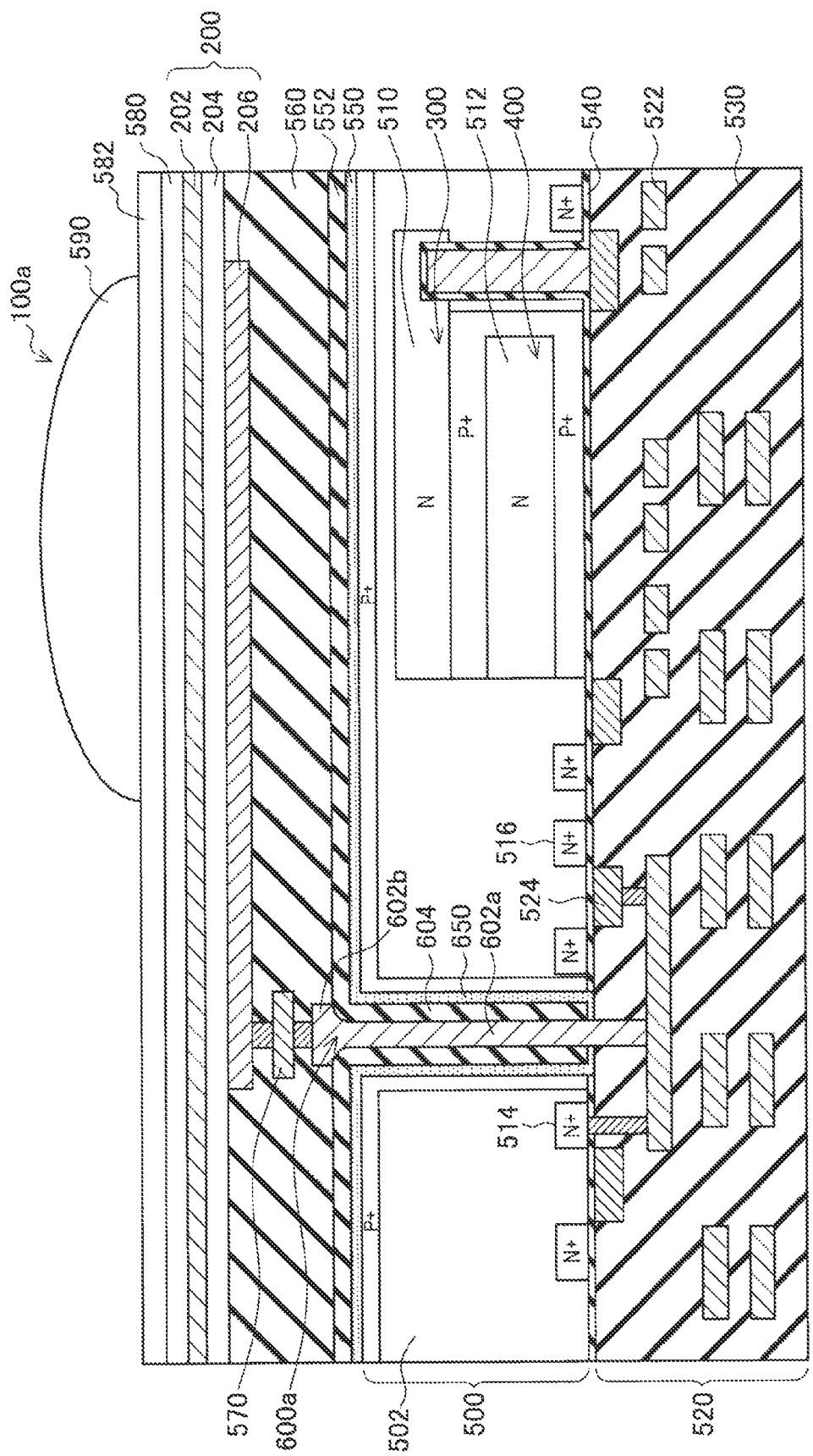
FIG. 14 is a cross-sectional view of a solid-state image sensor 100*a* according to a second embodiment of the present disclosure.
Figure 15:
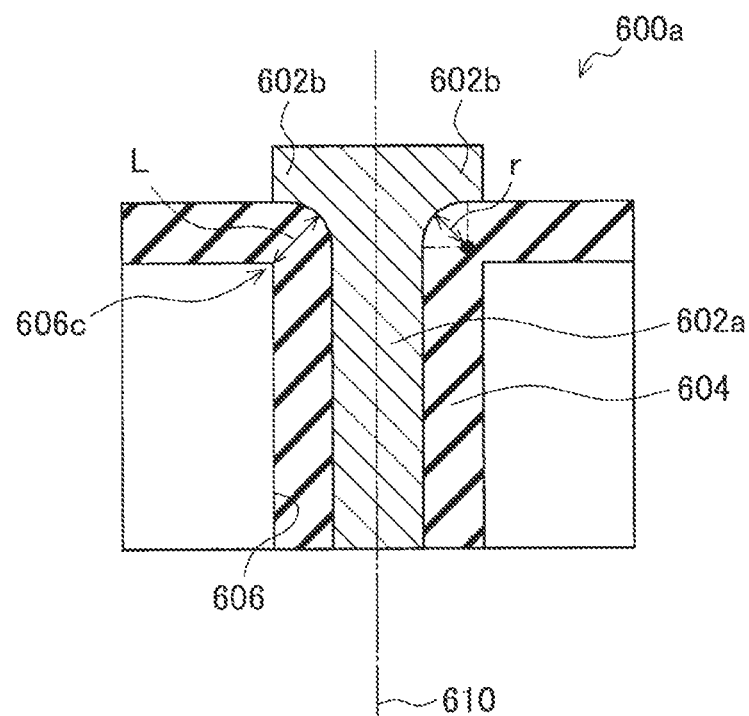
FIG. 15 is a diagram schematically illustrating an upper portion of a through electrode 600*a* according to the second embodiment of the present disclosure.

In embodiments of the present disclosure, the through electrode 600 according to the foregoing first embodiment can be further modified. Referring to FIG. 14 and FIG. 15, a through electrode 600*a* according to a second embodiment of the present disclosure will be described. FIG. 14 is a cross-sectional view of a solid-state image sensor 100*a* according to the present embodiment, specifically, a cross-sectional view of the solid-state image sensor 100*a* cut along the through direction of the through electrode 600*a*. FIG. 15 is a diagram of the upper portion of the through electrode 600*a* according to the present embodiment, specifically, a partially enlarged view of a cross section of the through electrode 600*a* cut along the through direction of the through electrode 600a. In FIG. 15, the fixed charge film 650 is not illustrated for ease of understanding.

As illustrated in FIG. 14, in a cross section of the solid-state image sensor 100a, a conductor 602a of the through electrode 600a according to the present embodiment has two branch portions (first branch portions) 602b split from the center axis (not illustrated in FIG. 14) of the conductor 602a, at the upper portion (the end portion on the PD 200 side) of the through electrode 600a, more specifically, at the upper end (the end surface on the PD 200 side) of the through electrode 600a. In the present embodiment, the branch portion 602b is bend so as to draw an arc from the center axis.

Specifically, as illustrated in FIG. 15 which is an enlarged view of the through electrode 600a according to the present embodiment, the upper portion (the end portion on the PD 200 side) of the conductor 602a has a shape with a radius of curvature toward the light incident surface of the semiconductor substrate 500. In other words, in the enlarged view above, the conductor 602a appears to have two branch portions 602b split so as to draw an arc from the center axis 610 of the conductor 602a. In the present embodiment, the radius of curvature r of the branch portion 602b is preferably 10 nm or more and 1000 nm or less. That is, it is preferable that the radius of curvature r is set to such a value that can ensure that the insulating film 604 has a film thickness capable of suppressing short-circuiting to the semiconductor substrate 500 (specifically, the semiconductor region 502) and also can ensure a large light incident surface on which light enters for the PDs 300 and 400, in the same manner as in the first embodiment.

According to the present embodiment, at the region of the branch portion 602b that draws an arc, the distance L to the conductor 602a from an opening end 606c on the upper side of the through hole 606 covered with the insulating film 604 and the fixed charge film 650 (not illustrated) is uniform, compared with the foregoing first embodiment. In the present embodiment, therefore, even when a high voltage is applied to the insulating film 604 and the fixed charge film 650, dielectric breakdown is less likely to occur at the branch portion 602b, thereby improving the withstand voltage (reliability) of the insulating film 604 and the fixed charge film 650.

In the present embodiment, in a cross section of the solid-state image sensor 100a, the conductor 602a of the through electrode 600a according to the present embodiment may have two branch portions (second branch portions) (not illustrated) split from the center axis 610 of the conductor 602a, at the lower portion (the end portion on the floating diffusion 514 side) of the through electrode 600a. More specifically, in the present embodiment, the conductor 602a may have two branch portions, for example, at the lower end (the end surface on the floating diffusion 514 side) of the through electrode 600a. In the present embodiment, the branch portion at the lower portion of the through electrode 600a may be bent so as to draw an arc from the center axis 610, similarly to the branch portion 602b. In such a case, the branch portion 602b at the upper portion of the through electrode 600a may have a radius of curvature r larger than that of the branch portion at the lower portion of the through electrode 600a.

7. Third Embodiment

Figure 16:
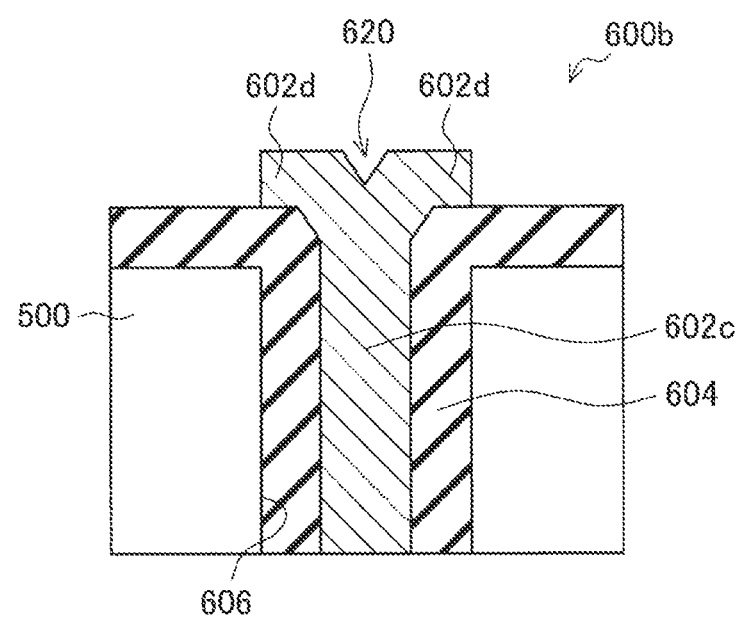
FIG. 16 is a diagram schematically illustrating an upper portion of a through electrode 600*b* according to a third embodiment of the present disclosure.

In embodiments of the present disclosure, the through electrode 600 according to the foregoing first embodiment can be further modified. Referring to FIG. 16, a through electrode 600b according to a third embodiment of the present disclosure will be described below. FIG. 16 is a diagram of the upper portion of the through electrode 600b according to the present embodiment, specifically, a partially enlarged view of a cross section of the through electrode 600b cut along the through direction of the through electrode 600b. In FIG. 16, the fixed charge film 650 is not illustrated for ease of understanding.

As illustrated in FIG. 16, in the above-noted cross section, a conductor 602c of the through electrode 600b according to the present embodiment has two branch portions (first branch portions) 602d split from the center axis of the conductor 602c, at the upper end (the end surface on the PD 200 side) of the through electrode 600a, in the same manner as in the foregoing third embodiment. In other words, the end portion on the PD 200 side of the conductor 602c according to the present embodiment has a shape expanding with a radius of curvature toward the light incident surface of the semiconductor substrate 500. In addition, in the present embodiment, as illustrated in FIG. 16, the conductor 602c further has a depression 620 positioned between the two branch portions 602d. That is, in the present embodiment, the conductor 602c is recessed at the center of the through hole 606 when the through hole 606 is viewed from above.

In the present embodiment, the depression 620 positioned between two branch portions 602d is provided to increase the contact area between the conductor 602c and the metal wiring 570 electrically connected to the through electrode 600b, thereby reducing the contact resistance between the conductor 602c and the metal wiring 570.

8. Fourth Embodiment

Figure 17:
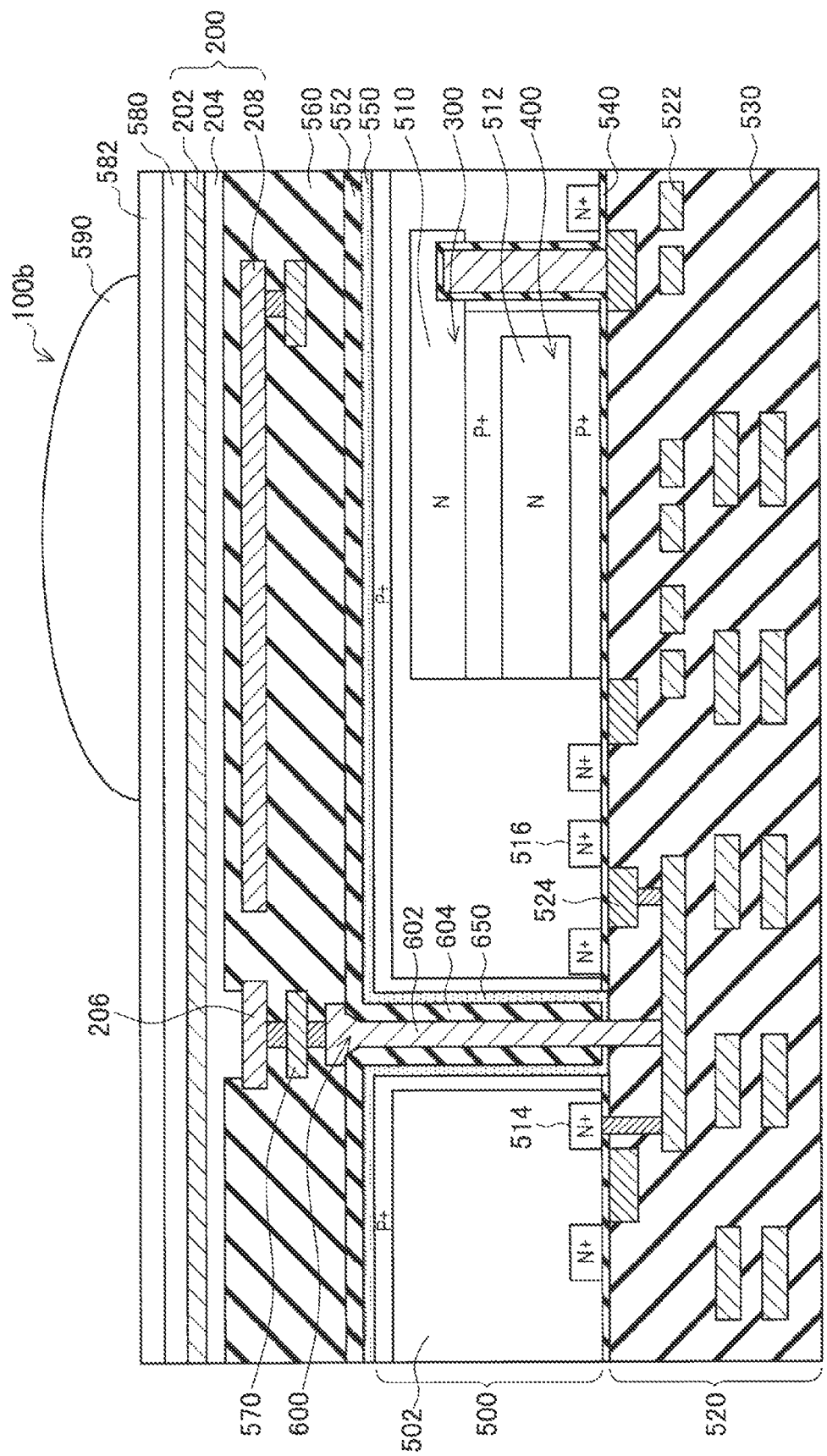
FIG. 17 is a cross-sectional view of a solid-state image sensor 100*b* according to a fourth embodiment of the present disclosure.

In embodiments of the present disclosure, the PD 200 of the solid-state image sensor 100 according to the foregoing first embodiment can be further modified. Referring to FIG. 17, a solid-state image sensor 100b according to a fourth embodiment of the present disclosure will be described below. FIG. 17 is a cross-sectional view of the solid-state image sensor 100b according to the present embodiment, specifically, a cross-sectional view of the solid-state image sensor 100b cut along the through direction of the through electrode 600. In FIG. 17, the solid-state image sensor 100b is illustrated such that the light incident surface on which light enters the solid-state image sensor 100b faces up.

In the present embodiment, as illustrated in FIG. 17, a PD 200a provided above the semiconductor substrate 500 includes the upper electrode 202, the photoelectric conversion film 204, and the lower electrode 206, similarly to the PD 200 according to the foregoing first embodiment. In the present embodiment, the PD 200a further includes an accumulation electrode 208 facing the upper electrode 202 with the photoelectric conversion film 204 and the insulating film 560 interposed therebetween. The accumulation electrode 208 is disposed at a distance from the lower electrode 206 and can be formed of, for example, a transparent conductor such as ITO and IZO, similarly to the upper electrode 202 and the lower electrode 206.

In the PD 200a according to the present embodiment, wiring (not illustrated) is electrically connected individually to each of the lower electrode 206 and the accumulation electrode 208 so that a desired potential can be applied to each of the lower electrode 206 and the accumulation electrode 208 through the wiring. In the present embodiment, therefore, the potentials applied to the lower electrode 206 and the accumulation electrode 208 are controlled so that charge generated in the photoelectric conversion film 204 can be accumulated in the photoelectric conversion film 204 or the charge can be taken out at the floating diffusion 514. In other words, the accumulation electrode 208 can function as an electrode for charge accumulation for drawing charge generated in the photoelectric conversion film 204 and accumulating the charge in the photoelectric conversion film 204 in accordance with the applied potential.

In the PD 200 according to the foregoing first embodiment, the charge generated by photoelectric conversion of the photoelectric conversion film 204 is directly accumulated in the floating diffusion 514 through the lower electrode 206 and the through electrode 600. Because of such a mechanism, complete depletion in the photoelectric conversion film 204 is difficult. As a result, in the first embodiment, kTC noise (reset noise) of the solid-state image sensor 100 is large and random noise is worse, possibly leading to reduction in quality of captured images. On the other hand, in the present embodiment, the accumulation electrode 208 is provided so that, in operation of the PD 200a, while the charge generated by photoelectric conversion of each photoelectric conversion film 204 is accumulated in the photoelectric conversion film 204, the charge reaching each lower electrode 206 is discharged to the outside system for resetting. In addition, in the operation, after resetting, the charge accumulated in each photoelectric conversion film 204 is transferred to the corresponding lower electrode 206, and the charge transferred to the lower electrode 206 can be read out sequentially. In operation of the PD 200a, the resetting and readout operation as described above is repeatedly performed. That is, in the present embodiment, at the start of exposure of the solid-state image sensor 100b, complete depletion and charge removal in the floating diffusion 514 are facilitated. As a result, the present embodiment can suppress occurrence of the phenomenon of reduction in quality of captured images due to increased kTC noise of the solid-state image sensor 100b and worse random noise.

9. Fifth Embodiment

Figure 18:
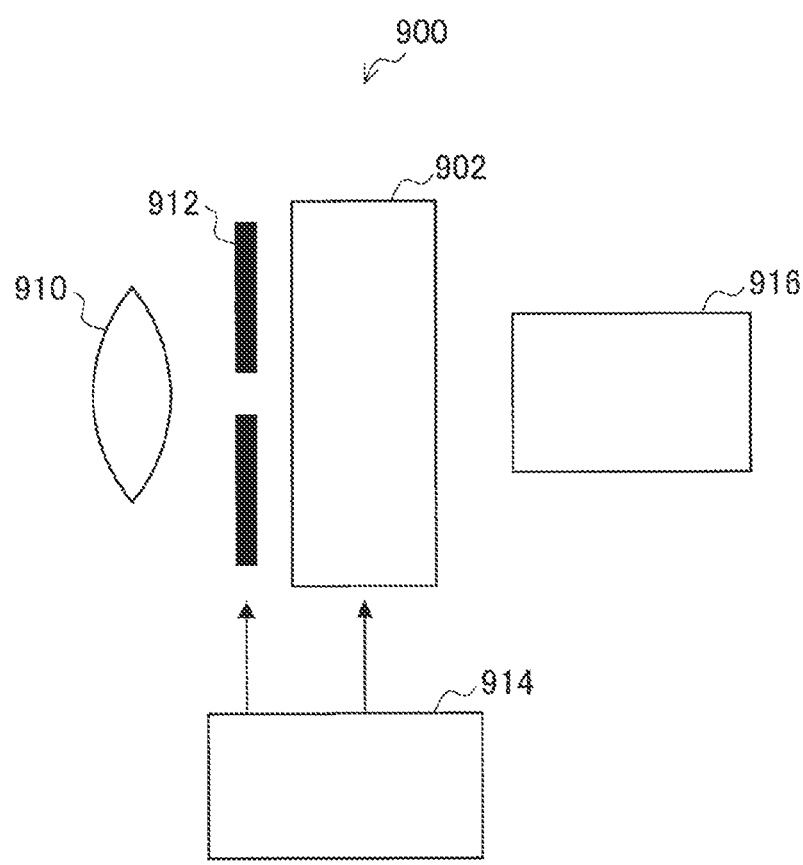
FIG. 18 is a diagram illustrating an example of an electronic device 900 according to a fifth embodiment of the present invention.

The solid-state imaging device 1 according to the foregoing embodiments of the present disclosure can be applied generally to electronic devices using imaging devices for image capturing units, such as imaging devices such as digital still cameras and camcorders, portable terminal devices having the image capturing function, and copiers including solid-state image sensors in image readers. Embodiments of the present disclosure can be further applied to robots, drones, automobiles, medical instruments (endoscopes), and the like that include the solid-state imaging device 1 described above. The solid-state imaging device 1 according to the present embodiment may be in the form of one chip or may be in the form of a module having the image capturing function including an imager and a signal processor or an optical system in one package. An example of an electronic device 900 including an imaging device 902 having the solid-state imaging device 1 will be described as a fifth embodiment of the present disclosure, with reference to FIG. 18. FIG. 18 is a diagram illustrating an example of the electronic device 900 according to the present embodiment.

As illustrated in FIG. 18, the electronic device 900 includes the imaging device 902, an optical lens 910, a shutter mechanism 912, a drive circuit unit 914, and a signal processing circuit unit 916. The optical lens 910 focuses image light (incident light) from a subject onto an imaging plane of the imaging device 902. Signal charges are thus accumulated for a certain period of time in the solid-state image sensors 100 of the solid-state imaging device 1 of the imaging device 902. The shutter mechanism 912 is opened and closed to control a light radiation period and a light cut-off period for the imaging device 902. The drive circuit unit 914 supplies a drive signal for controlling, for example, the signal transfer operation of the imaging device 902 and the shutter operation of the shutter mechanism 912 to the device and the mechanism. That is, the imaging device 902 performs signal transfer based on a drive signal (timing signal) supplied from the drive circuit unit 914. The signal processing circuit unit 916 performs a variety of signal processing. For example, the signal processing circuit unit 916 outputs a picture signal subjected to signal processing to, for example, a storage medium (not illustrated) such as a memory or to a display (not illustrated).

10. Sum-Up

As explained above, according to the embodiments and modifications of the present disclosure, the resistance value of the through electrode 600 can be kept low.

In the foregoing embodiments of the present disclosure, the solid-state image sensor 100 may be of a structure having two or three or more PDs 200 stacked above the semiconductor substrate 500. In such a case, the through electrode 600 according to the present embodiment can be used, for example, as a through electrode for transferring the charge generated in the PD 200 stacked on the upper side, of two PDs 200 stacked above the semiconductor substrate 500, to the floating diffusion 514 provided in the semiconductor substrate 500.

In the foregoing embodiments of the present disclosure, the solid-state image sensor 100 in which the first conductivity type is P-type and the second conductivity type is N-type and electrons are used as signal charges has been described. However, embodiments of the present disclosure are not limited to such an example. For example, the present embodiment can be applied to the solid-state image sensor 100 in which the first conductivity type is N-type, the second conductivity type is P-type, and holes are signal charges.

In the foregoing embodiments of the present disclosure, the semiconductor substrate 500 is not necessarily a silicon substrate and may be any other substrate (for example, a silicon-on-insulator (SOI) substrate or a SiGe substrate). The semiconductor substrate 500 described above may have a semiconductor structure and the like formed on such a variety of substrates.

The solid-state image sensor 100 according to embodiments of the present disclosure is not limited to a solid-state image sensor that detects a distribution of the quantity of incident light of visible light to capture an image. For example, the present embodiment can be applied to a solid-state image sensor that captures a distribution of the quantity of incidence of infrared rays, X rays, particles, or the like as an image, and a solid-state image sensor (physical quantity distribution detecting device), such as finger print detecting sensor, that detects a distribution of any other physical quantities such as pressure and capacitance as an image.

11. Application to Endoscopic Surgery System

The technique according to the present disclosure (the present technique) is applicable to a variety of products. For example, the technique according to the present disclosure may be applied to an endoscopic surgery system.

Figure 19:
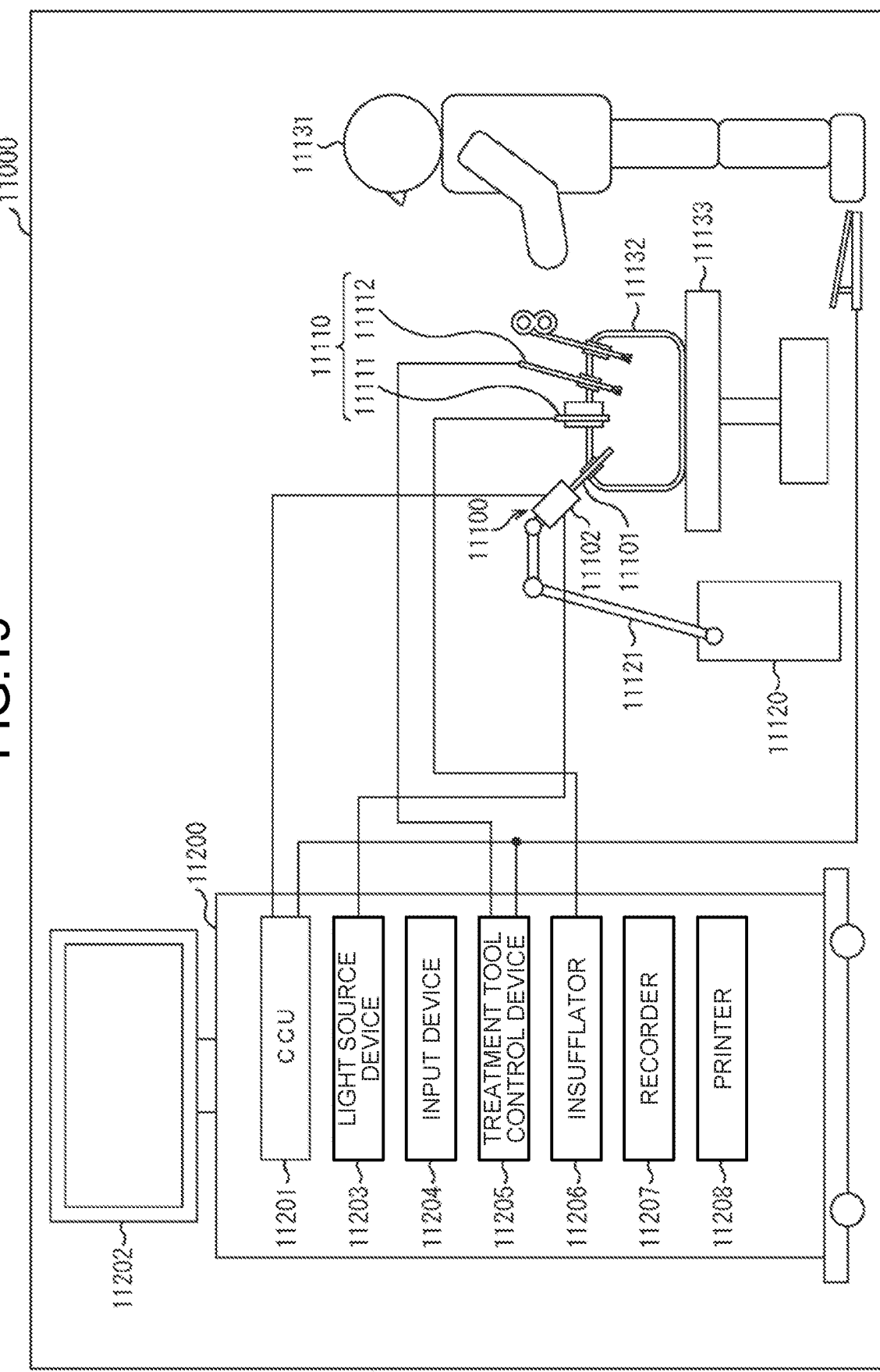
FIG. 19 is a diagram illustrating an example of the overall configuration of an endoscopic surgery system.

FIG. 19 is a diagram illustrating an example of the overall configuration of an endoscopic surgery system to which the technique according to the present disclosure (the present technique) is applicable.

FIG. 19 illustrates a situation in which an operator (doctor) 11131 uses an endoscopic surgery system 11000 to perform an operation on a patient 11132 on a patient bed 11133. As illustrated in the drawing, the endoscopic surgery system 11000 includes an endoscope 11100, other surgical instruments 11110 such as an insufflation tube 11111 and an energy treatment tool 11112, a support arm device 11120 supporting the endoscope 11100, and a cart 11200 carrying a variety of devices for endoscopic surgery.

The endoscope 11100 includes a barrel 11101 having a region of a predetermined length from its tip end to be inserted into the body cavity of the patient 11132, and a camera head 11102 connected to the base end of the barrel 11101. In the example illustrated in the drawing, the endoscope 11100 is a rigid borescope having a rigid barrel 11101. However, the endoscope 11100 may be configured as a soft borescope having a soft barrel.

The tip end of the barrel 11101 has an opening having an objective lens fitted therein. A light source device 11203 is connected to the endoscope 11100. Light generated by the light source device 11203 is propagated to the tip end of the barrel through a light guide extending inside the barrel 11101 and irradiates an observation target in the body cavity of the patient 11132 through the objective lens. The endoscope 11100 may be a forward-viewing endoscope or may be a forward-oblique viewing endoscope or a side-viewing endoscope.

An optical system and an image sensor are provided inside the camera head 11102. Reflected light (observation light) from an observation target is collected by the optical system onto the image sensor. The observation light is converted to electricity by the image sensor to generate an electrical signal corresponding to the observation light, that is, an image signal corresponding to an observation image. The image signal is transmitted as RAW data to a camera control unit (CCU) 11201.

The CCU 11201 is configured with a central processing unit (CPU), a graphics processing unit (GPU), or the like to centrally control the operation of the endoscope 11100 and a display device 11202. The CCU 11201 receives an image signal from the camera head 11102 and performs a variety of image processing on the image signal, for example, a development process (demosaicing) for displaying an image based on the image signal.

The display device 11202 displays an image based on the image signal subjected to image processing by the CCU 11201, under the control of the CCU 11201.

The light source device 11203 is configured with a light source such as a light emitting diode (LED) and supplies the endoscope 11100 with radiation light in imaging a surgery site.

An input device 11204 is an input interface with the endoscopic surgery system 11000. The user can input a variety of information and instructions to the endoscopic surgery system 11000 through the input device 11204. For example, the user inputs an instruction to change the imaging conditions by the endoscope 11100 (the kind of radiation light, magnification, focal length, etc.).

A treatment tool control device 11205 controls actuation of the energy treatment tool 11112 for cauterization of tissues, incision, or sealing of blood vessels. An insufflator 11206 feeds gas into the body cavity through the insufflation tube 11111 to insufflate the body cavity of the patient 11132 in order to ensure the field of view with the endoscope 11100 and ensure a working space for the operator. A recorder 11207 is a device capable of recording a variety of information on surgery. A printer 11208 is a device capable of printing a variety of information on surgery in a variety of forms such as text, image, or graph.

The light source device 11203 that supplies the endoscope 11100 with radiation light in imaging a surgery site can be configured with, for example, a white light source such as an LED, a laser light source, or a combination thereof. When a white light source is configured with a combination of RGB laser light sources, the output power and the output timing of each color (each wavelength) can be controlled accurately, and, therefore, the white balance of the captured image can be adjusted in the light source device 11203. In this case, an observation target is irradiated time-divisionally with laser light from each of the RGB laser light sources, and actuation of the image sensor in the camera head 11102 is controlled in synchronization with the radiation timing, whereby an image corresponding to each of R, G, and B can be captured time-divisionally. According to this method, a color image can be obtained even without color filters in the image sensor.

The actuation of the light source device 11203 may be controlled such that the intensity of output light is changed every certain time. In synchronization with the timing of changing the intensity of light, the actuation of the image sensor in the camera head 11102 is controlled to acquire images time-divisionally, and the images are combined to generate an image with a high dynamic range free from blocked-up shadows and blown out highlights.

The light source device 11203 may be configured to supply light in a predetermined wavelength band corresponding to specific light observation. In specific light observation, for example, narrow band imaging is performed, which uses the wavelength dependency of light absorption in body tissues and applies light in a narrow band, compared with radiation light (that is, white light) in normal observation, to capture an image of predetermined tissues such as blood vessels in the outermost surface of mucosa. Alternatively, in specific light observation, fluorescence observation may be performed in which an image is acquired by fluorescence generated by radiation of excitation light. In fluorescence observation, for example, excitation light is applied to body tissues and fluorescence from the body tissues is observed (autofluorescence imaging), or a reagent such as indocyanine green (ICG) is locally injected to body tissues and excitation light corresponding to the fluorescence wavelength of the reagent is applied to the body tissues to obtain a fluorescence image. The light source device 11203 may be configured to supply narrow-band light and/or excitation light corresponding to such specific light observation.

Figure 20:
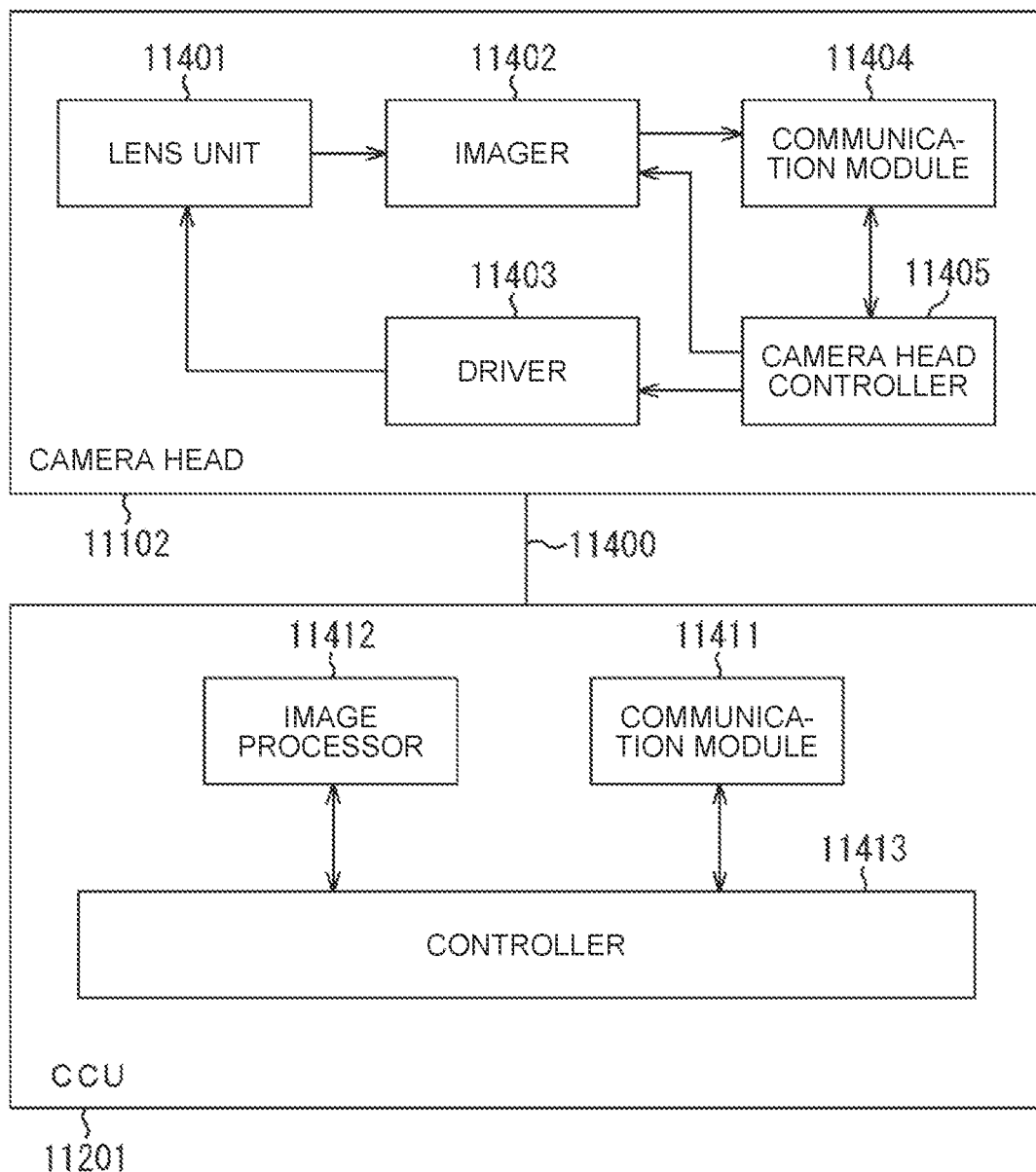
FIG. 20 is a block diagram illustrating an example of the functional configuration of a camera head and a CCU.

FIG. 20 is a block diagram illustrating an example of the functional configuration of the camera head 11102 and the CCU 11201 illustrated in FIG. 19.

The camera head 11102 includes a lens unit 11401, an imager 11402, a driver 11403, a communication module 11404, and a camera head controller 11405. The CCU 11201 includes a communication module 11411, an image processor 11412, and a controller 11413. The camera head 11102 and the CCU 11201 are connected to communicate with each other through a transmission cable 11400.

The lens unit 11401 is an optical system provided at a connection portion to the barrel 11101. Observation light taken in from the tip end of the barrel 11101 is propagated to the camera head 11102 and enters the lens unit 11401. The lens unit 11401 is configured with a combination of a plurality of lenses including a zoom lens and a focus lens.

The imager 11402 is configured with an image sensor. The imager 11402 may be configured with one image sensor (called single sensor-type) or a plurality of image sensors (called multi sensor-type). When the imager 11402 is a multi-sensor construction, for example, image signals corresponding to R, G, and B may be generated by image sensors and combined to produce a color image. Alternatively, the imager 11402 may have a pair of image sensors for acquiring image signals for right eye and for left eye corresponding to three-dimensional (3D) display. The 3D display enables the operator 11131 to more accurately grasp the depth of living tissues in a surgery site. When the imager 11402 is a multi-sensor construction, several lines of lens units 11401 may be provided corresponding to the image sensors.

The imager 11402 is not necessarily provided in the camera head 11102. For example, the imager 11402 may be provided immediately behind the objective lens inside the barrel 11101.

The driver 11403 is configured with an actuator and moves the zoom lens and the focus lens of the lens unit 11401 by a predetermined distance along the optical axis under the control of the camera head controller 11405. The magnification and the focal point of a captured image by the imager 11402 thus can be adjusted as appropriate.

The communication module 11404 is configured with a communication device for transmitting/receiving a variety of information to/from the CCU 11201. The communication module 11404 transmits an image signal obtained from the imager 11402 as RAW data to the CCU 11201 through the transmission cable 11400.

The communication module 11404 receives a control signal for controlling actuation of the camera head 11102 from the CCU 11201 and supplies the received signal to the camera head controller 11405. The control signal includes, for example, information on imaging conditions, such as information specifying a frame rate of the captured images, information specifying an exposure value in imaging, and/or information specifying a magnification and a focal point of the captured image.

The image conditions such as frame rate, exposure value, magnification, and focal point may be specified as appropriate by the user or may be automatically set by the controller 11413 of the CCU 11201 based on the acquired image signal. In the latter case, the endoscope 11100 is equipped with an auto exposure (AE) function, an auto focus (AF) function, and an auto white balance (AWB) function.

The camera head controller 11405 controls actuation of the camera head 11102, based on a control signal received from the CCU 11201 through the communication module 11404.

The communication module 11411 is configured with a communication device for transmitting/receiving a variety of information to/from the camera head 11102. The communication module 11411 receives an image signal transmitted from the camera head 11102 through the transmission cable 11400.

The communication module 11411 transmits a control signal for controlling actuation of the camera head 11102 to the camera head 11102. The image signal and the control signal can be transmitted via electrical communication or optical communication.

The image processor 11412 performs a variety of image processing on the image signal that is RAW data transmitted from the camera head 11102.

The controller 11413 performs a variety of control on imaging of a surgery site and the like by the endoscope 11100 and display of a captured image obtained by imaging of a surgery site and the like. For example, the controller 11413 generates a control signal for controlling actuation of the camera head 11102.

The controller 11413 displays a captured image visualizing a surgery site and the like on the display device 11202, based on the image signal subjected to image processing by the image processor 11412. In doing so, the controller 11413 may recognize a variety of objects in the captured image using a variety of image recognition techniques. For example, the controller 11413 detects the shape of edge, color, and the like of an object included in the captured image to recognize a surgical instrument such as forceps, a specific living body site, bleeding, and mist in use of the energy treatment tool 11112. When displaying the captured image on the display device 11202, the controller 11413 may use the recognition result to superimpose a variety of surgery assisting information on the image of the surgery site. The surgery assisting information superimposed and presented to the operator 11131 can alleviate burden on the operator 11131 or ensure the operator 11131 to proceed surgery.

The transmission cable 11400 connecting the camera head 11102 and the CCU 11201 is an electrical signal cable corresponding to communication of electrical signals, an optical fiber corresponding to optical communication, or a composite cable thereof.

In the example illustrated in the drawing, the transmission cable 11400 is used for wired communication. However, communication between the camera head 11102 and the CCU 11201 may be wireless.

An example of the endoscopic surgery system to which the technique according to the present disclosure is applicable has been described above. The technique according to the present disclosure may be applicable to, for example, the endoscope 11100, the imager 11402 in the camera head 11102, and the image processor 11412 of the CCU 11201 in the configuration described above. For example, the solid-state imaging device 1 illustrated in FIG. 1 can be applied to the endoscope 11100, the imager 11402, the image processor 11412, and the like. When the technique according to the present disclosure is applied to the endoscope 11100, the imager 11402, the image processor 11412, and the like, a sharper surgery site image can be obtained to ensure that the operator examines the surgery site.

Although the endoscopic surgery system has been described here by way of example, the technique according to the present disclosure may be applied to, for example, a microscopic surgery system.

12. Application to Movable Body

The technique according to the present disclosure (the present technique) is applicable to a variety of products. For example, the technique according to the present disclosure may be implemented as a device mounted on any type of movable bodies, such as automobiles, electric vehicles, hybrid electric vehicles, motorcycles, bicycles, personal mobility devices, airplanes, drones, vessels and ships, and robots.

Figure 21:
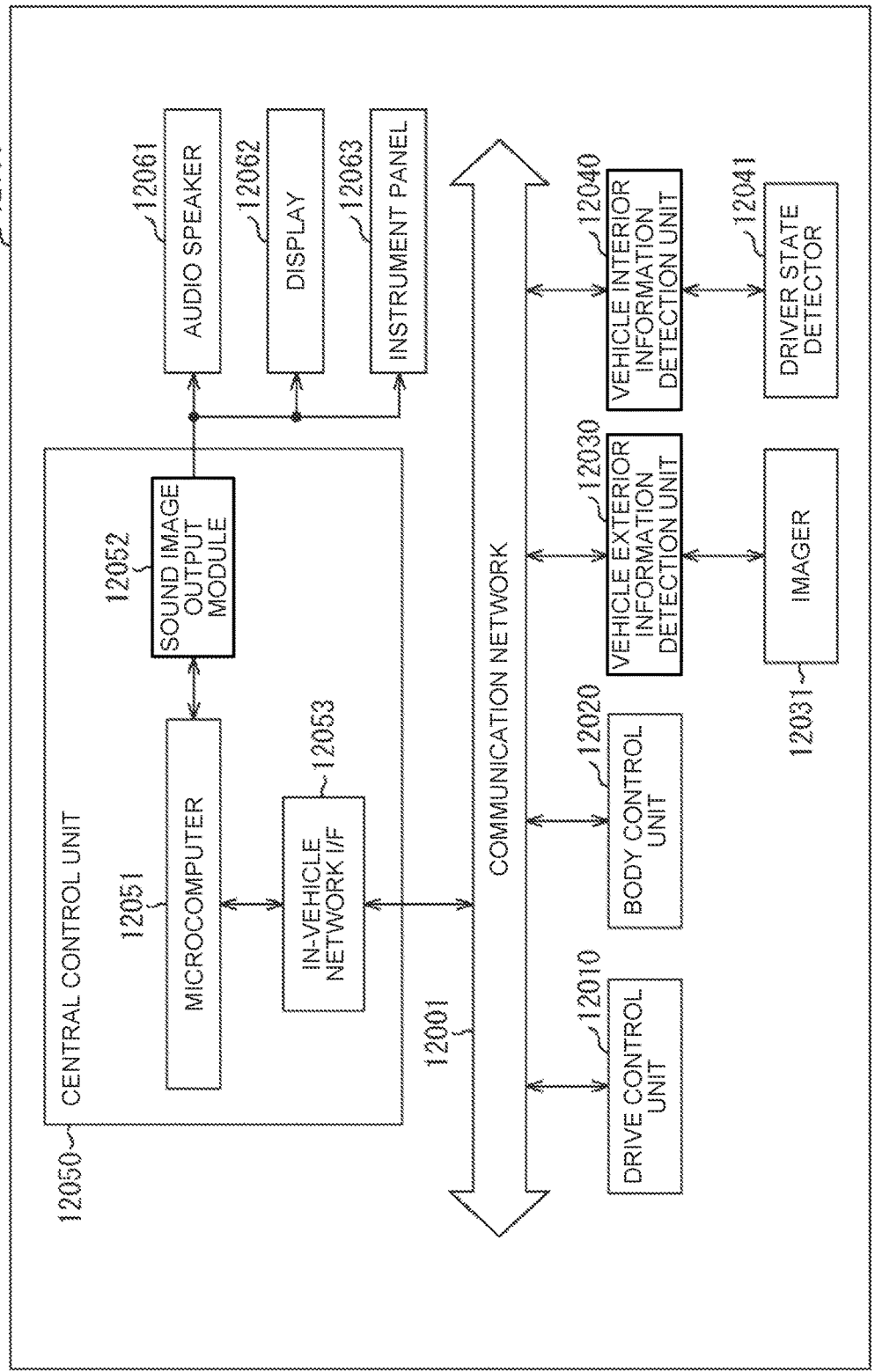
FIG. 21 is a diagram illustrating an example of the overall configuration of a vehicle control system.

FIG. 21 is a block diagram illustrating an example of the overall configuration of a vehicle control system that is an example of a movable body control system to which the technique according to the present disclosure is applicable.

A vehicle control system 12000 includes a plurality of electronic control units connected through a communication network 12001. In the example illustrated in FIG. 21, the vehicle control system 12000 includes a drive control unit 12010, a body control unit 12020, a vehicle exterior information detection unit 12030, a vehicle interior information detection unit 12040, and a central control unit 12050. As a functional configuration of the central control unit 12050, a microcomputer 12051, a sound image output module 12052, and an in-vehicle network I/F (interface) 12053 are illustrated.

The drive control unit 12010 controls operation of devices related to a drive system of a vehicle in accordance with a variety of computer programs. For example, the drive control unit 12010 functions as a control device for a drive force generating device for generating drive force of the vehicle, such as an internal combustion engine or a drive motor, a drive force transmission mechanism for transmitting drive force to the wheels, a steering mechanism for adjusting the steering angle of the vehicle, and a braking device for generating braking force of the vehicle.

The body control unit 12020 controls operation of a variety of devices installed in the vehicle body in accordance with a variety of computer programs. For example, the body control unit 12020 functions as a control device for a keyless entry system, a smart key system, a power window device, or a variety of lamps such as head lamps, rear lamps, brake lamps, turn signals, and fog lamps. In this case, the body control unit 12020 may receive radio waves transmitted from a portable device alternative to a key or signals from a variety of switches. The body control unit 12020 accepts input of the radio waves or signals and controls a door lock device, a power window device, a lamp, and the like of the vehicle.

The vehicle exterior information detection unit 12030 detects information on the outside of the vehicle equipped with the vehicle control system 12000. For example, an imager 12031 is connected to the vehicle exterior information detection unit 12030. The vehicle exterior information detection unit 12030 allows the imager 12031 to capture an image of the outside of the vehicle and receives the captured image. The vehicle exterior information detection unit 12030 may perform an object detection process or a distance detection process for persons, vehicles, obstacles, signs, or characters on roads, based on the received image.

The imager 12031 is an optical sensor that receives light and outputs an electrical signal corresponding to the quantity of received light of the light. The imager 12031 may output an electrical signal as an image or output as information on a measured distance. Light received by the imager 12031 may be visible light or invisible light such as infrared rays.

The vehicle interior information detection unit 12040 detects information on the inside of the vehicle. The vehicle interior information detection unit 12040 is connected to, for example, a driver state detector 12041 that detects a state of the driver. The driver state detector 12041 includes, for example, a camera for taking an image of the driver, and the vehicle interior information detection unit 12040 may calculate the degree of fatigue or the degree of concentration of the driver or may determine whether the driver falls asleep, based on detection information input from the driver state detector 12041.

The microcomputer 12051 can compute a control target value for the drive force generating device, the steering mechanism, or the braking device, based on information on the inside and outside of the vehicle acquired by the vehicle exterior information detection unit 12030 or the vehicle interior information detection unit 12040, and output a control command to the drive control unit 12010. For example, the microcomputer 12051 can perform coordination control for the purpose of function implementation of advanced driver assistance systems (ADAS), including collision avoidance or shock mitigation of the vehicle, car-following drive based on the distance between vehicles, vehicle speed-keeping drive, vehicle collision warning, and lane departure warning.

The microcomputer 12051 can perform coordination control for the purpose of, for example, autonomous driving, in which the drive force generating device, the steering mechanism, or the braking device is controlled based on information on the surroundings of the vehicle acquired by the vehicle exterior information detection unit 12030 or the vehicle interior information detection unit 12040 to enable autonomous driving without depending on the operation by the driver.

The microcomputer 12051 can output a control command to the body control unit 12020, based on information on the outside of the vehicle acquired by the vehicle exterior information detection unit 12030. For example, the microcomputer 12051 can perform coordination control for the antidazzle purpose, for example, by controlling the head lamps in accordance with the position of a vehicle ahead or an oncoming vehicle detected by the vehicle exterior information detection unit 12030 to switch high beams to low beams.

The sound image output module 12052 transmits an output signal of at least one of sound and image to an output device capable of visually or aurally giving information to a passenger in the vehicle or the outside of the vehicle. In the example in FIG. 21, an audio speaker 12061, a display 12062, and an instrument panel 12063 are illustrated as the output device. The display 12062 may include, for example, at least one of an on-board display and a head-up display.

Figure 22:
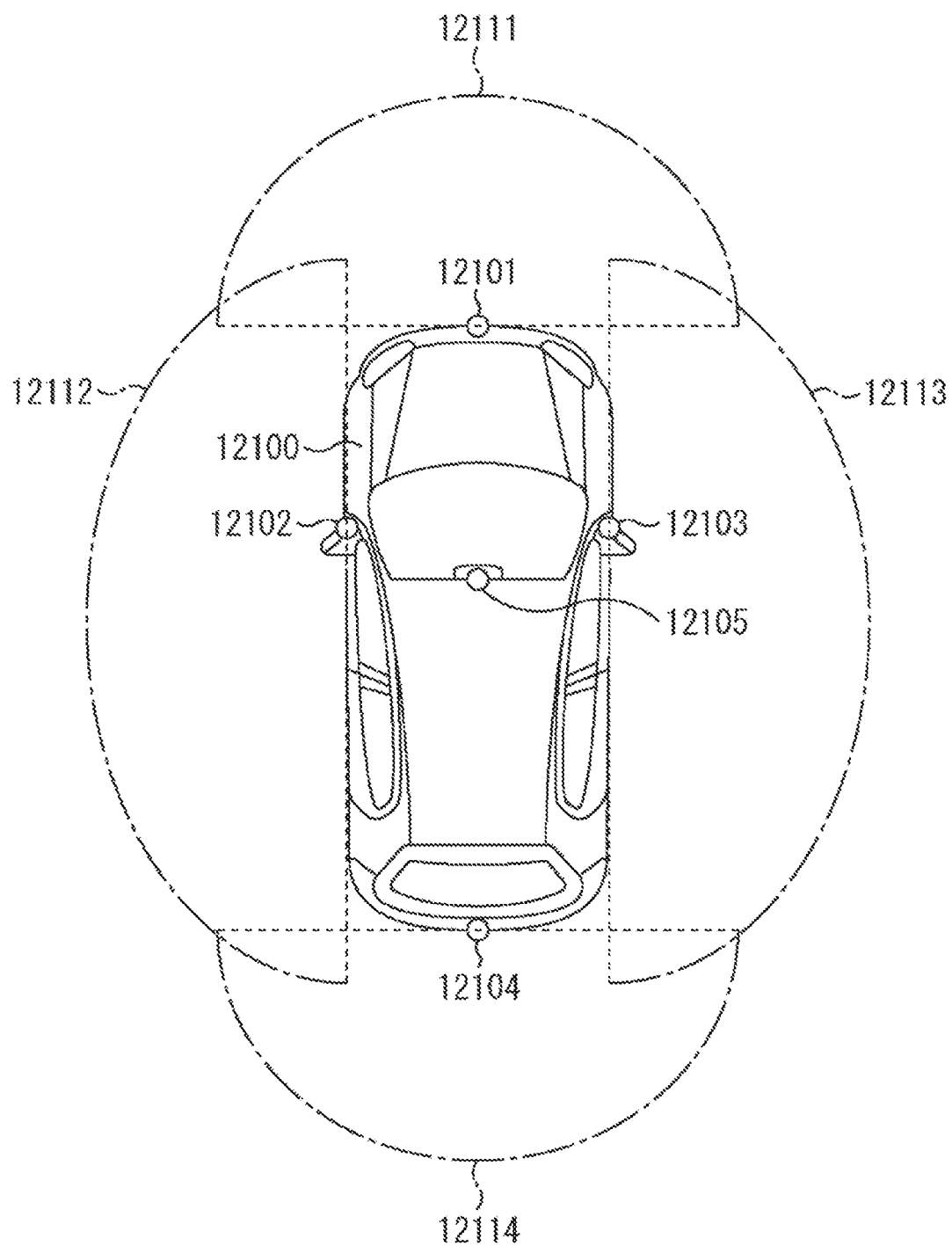
FIG. 22 is a diagram illustrating an example of the installation position of a vehicle exterior information detector and an imager.

FIG. 22 is a diagram illustrating an example of the installation position of the imager 12031.

In FIG. 22, a vehicle 12100 has imagers 12101, 12102, 12103, 12104, and 12105 as the imager 12031.

The imagers 12101, 12102, 12103, 12104, and 12105 are provided, for example, at positions such as front nose, side mirrors, rear bumper, back door of the vehicle 12100, and an upper portion of the front glass inside the vehicle. The imager 12101 provided at the front nose and the imager 12105 provided at the upper portion of the front glass inside the vehicle mainly acquire an image in front of the vehicle 12100. The imagers 12102 and 12103 provided at the side mirrors mainly acquire images on the sides of the vehicle 12100. The imager 12104 provided at the rear bumper or the back door mainly acquires an image behind the vehicle 12100. The images ahead acquired by the imagers 12101 and 12105 are mainly used for detecting a vehicle ahead, pedestrians, obstacles, traffic signs, road signs, or traffic lanes, for example.

FIG. 22 illustrates an example of the imaging ranges of the imagers 12101 and 12104. An imaging range 12111 indicates an imaging range of the imager 12101 provided at the front nose, imaging ranges 12112 and 12113 indicate the imaging ranges of the imagers 12102 and 12103 provided at the side mirrors, and an imaging range 12114 indicates the imaging range of the imager 12104 provided at the rear bumper or the back door. For example, a bird's eye view of the vehicle 12100 viewed from above can be obtained by superimposing image data captured by the imagers 12101 and 12104.

At least one of the imagers 12101 and 12104 may have a function of acquiring distance information. For example, at least one of the imagers 12101 and 12104 may be a stereo camera including a plurality of image sensors or may be an image sensor having a pixel for phase difference detection.

For example, the microcomputer 12051 can obtain the distance to a three-dimensional object within the imaging range 12111 or 12114 and a temporal change of this distance (relative speed to the vehicle 12100), based on distance information obtained from the imager 12101 or 12104, to specifically extract a three-dimensional object closest to the vehicle 12100 on the path of travel and traveling at a predetermined speed (for example, 0 km/h or more) in substantially the same direction as the vehicle 12100, as a vehicle ahead. In addition, the microcomputer 12051 can preset a distance between vehicles to be kept in front of a vehicle ahead and perform, for example, automatic braking control (including car-following stop control) and automatic speed-up control (including car-following startup control). In this way, coordination control can be performed, for example, for the purpose of autonomous driving in which the vehicle runs autonomously without depending on the operation by the driver.

For example, the microcomputer 12051 can classify three-dimensional object data on a three-dimensional object into two-wheel vehicle, standard-sized vehicle, heavy vehicle, pedestrian, utility pole, or any other three-dimensional object, based on the distance information obtained from the imager 12101 or 12104, and can use the extracted data for automatic avoidance of obstacles. For example, the microcomputer 12051 identifies an obstacle in the surroundings of the vehicle 12100 as an obstacle visible to the driver of the vehicle 12100 or as an obstacle hardly visible. The microcomputer 12051 then determines a collision risk indicating the degree of risk of collision with each obstacle and, when the collision risk is equal to or higher than a setting value and there is a possibility of collision, outputs an alarm to the driver through the audio speaker 12061 or the display 12062, or performs forced deceleration or avoidance steering through the drive control unit 12010, thereby implementing drive assistance for collision avoidance.

At least one of the imagers 12101 and 12104 may be an infrared camera that detects infrared rays. For example, the microcomputer 12051 can recognize a pedestrian by determining whether a pedestrian exists in the captured image by the imager 12101 or 12104. Such recognition of pedestrians is performed, for example, through the procedure of extracting feature points in the captured image by the imager 12101 or 12104 serving as an infrared camera and the procedure of performing pattern matching with a series of feature points indicating the outline of an object to determine whether the object is a pedestrian. When the microcomputer 12051 determines that a pedestrian exists in the captured image by the imager 12101 or 12104 and recognizes a pedestrian, the sound image output module 12052 controls the display 12062 such that a rectangular outline for highlighting the recognized pedestrian is superimposed. The sound image output module 12052 may control the display 12062 such that an icon indicating a pedestrian appears at a desired position.

An example of the vehicle control system to which the technique according to the present disclosure is applicable has been described above. The technique according to the present disclosure is applicable to the imager 12031 and the like in the configuration described above. For example, the solid-state imaging device 1 illustrated in FIG. 1 is applicable to the imager 12031. When the technique according to the present disclosure is applied to the imager 12031, a more visible captured image can be obtained to alleviate the driver's fatigue.

13. Supplemental Remarks

Although preferred embodiments of the present disclosure have been described in detail above with reference to the accompanying drawings, the technical scope of the present disclosure is not limited to such embodiments. It is obvious that one having ordinary knowledge in the technical field of the present disclosure would arrive at a variety of changes and modifications without departing from the technical idea recited in the claims, and it should be understood that these changes and modifications fall within the technical scope of the present disclosure as a matter of course.

The effects described in the present description are merely explanatory or illustrative and are not intended to be limitative. The technique according to the present disclosure may achieve other effects apparent to those skilled in the art from the disclosure in the present description, in addition to or instead of the effects described above.

The following configuration may fall within the technical scope of the present disclosure.

(1)
   A solid-state image sensor comprising:
      a semiconductor substrate;
      a charge accumulator disposed in the semiconductor substrate and configured to accumulate charge;
      a photoelectric converter disposed above the semiconductor substrate and configured to convert light to charge; and
      a through electrode passing through the semiconductor substrate and electrically connecting the charge accumulator with the photoelectric converter, wherein
      at an end portion on the photoelectric converter side of the through electrode,
      a cross-sectional area of a conductor positioned at a center of the through electrode in a cut section orthogonal to a through direction of the through electrode gradually increases toward the photoelectric converter along the through direction.

(2)
   The solid-state image sensor according to (1), wherein the through electrode electrically connects the photoelectric converter with at least one or more pixel transistors disposed in the semiconductor substrate.

(3)
   The solid-state image sensor according to (1) or (2), further comprising an insulating film covering an outer periphery of the conductor of the through electrode.

(4)
   The solid-state image sensor according to any one of (1) to (3), wherein a gradient of an outer peripheral surface at the end portion on the photoelectric converter side of the conductor has an angle of 1° or more and 60° or less with respect to a center axis of the conductor extending in the through direction.

(5)
   The solid-state image sensor according to any one of (1) to (3), wherein the conductor has a substantially cylindrical shape.

(6)
   The solid-state image sensor according to (5), wherein a diameter of the conductor in the cut section on the photoelectric converter side is 1.2 times or more a diameter of the conductor in the cut section on the charge accumulator side.

(7)
  The solid-state image sensor according to any one of (1) to (3), wherein
  in a cross section of the through electrode cut along the through direction,
  the end portion on the photoelectric converter side of the conductor has two first branch portions split from a center axis of the conductor.
(8)
  The solid-state image sensor according to (7), wherein the end portion on the photoelectric converter side of the conductor further has a depression positioned between the two first branch portions.
(9)
  The solid-state image sensor according to (7) or (8), wherein each of the first branch portions is bent so as to draw an arc from the center axis.
(10)
  The solid-state image sensor according to (9), wherein each of the first branch portions is bent with a radius of curvature of 10 nm or more and 1000 nm or less.
(11)
  The solid-state image sensor according to (7), wherein in a cross section of the through electrode cut along the through direction, an end portion on the charge accumulator side of the conductor has two second branch portions split from the center axis.
(12)
  The solid-state image sensor according to (11), wherein each of the first branch portions and each of the second branch portions are bent so as to draw an arc from the center axis.
(13)
  The solid-state image sensor according to (12), wherein a radius of curvature of the first branch portion is larger than a radius of curvature of the second branch portion.
(14)
  The solid-state image sensor according to any one of (1) to (13), wherein the end portion on the photoelectric converter side of the conductor electrically connects with wiring including a transparent conductor.
(15)
  The solid-state image sensor according to any one of (1) to (14), wherein
  the photoelectric converter includes
  a common electrode shared between the solid-state image sensors adjacent to each other,
  a readout electrode electrically connected to the through electrode, and
  a photoelectric conversion film sandwiched between the common electrode and the readout electrode and configured to convert light to charge.
(16)
  The solid-state image sensor according to (15), wherein the photoelectric conversion film includes an organic material.
(17)
  The solid-state image sensor according to (15) or (16), wherein the photoelectric converter further includes an accumulation electrode facing the common electrode with the photoelectric conversion film and an insulating film interposed therebetween.
(18)
  The solid-state image sensor according to any one of (1) to (17), further comprising another photoelectric converter disposed in the semiconductor substrate and configured to convert light to charge.
(19)
  A solid-state imaging device comprising a plurality of solid-state image sensors arranged in a matrix,
  each of the solid-state image sensors comprising:
  a semiconductor substrate;
  a charge accumulator disposed in the semiconductor substrate and configured to accumulate charge;
  a photoelectric converter disposed above the semiconductor substrate and configured to convert light to charge; and
  a through electrode passing through the semiconductor substrate and electrically connecting the charge accumulator with the photoelectric converter, wherein
  at an end portion on the photoelectric converter side of the through electrode,
  a cross-sectional area of a conductor positioned at a center of the through electrode in a cut section orthogonal to a through direction of the through electrode gradually increases toward the photoelectric converter along the through direction.
(20)
  A method of manufacturing a solid-state image sensor, the image sensor comprising
  a semiconductor substrate,
  a charge accumulator disposed in the semiconductor substrate and configured to accumulate charge,
  a photoelectric converter disposed above the semiconductor substrate and configured to convert light to charge, and
  a through electrode passing through the semiconductor substrate and electrically connecting the charge accumulator with the photoelectric converter, wherein
  at an end portion on the photoelectric converter side of the through electrode,
  a cross-sectional area of a conductor positioned at a center of the through electrode in a cut section orthogonal to a through direction of the through electrode gradually increases toward the photoelectric converter along the through direction,
  the method comprising:
  forming a through hole passing through the semiconductor substrate;
  depositing an insulating film to cover an inner wall of the through hole;
  etching the insulating film at an end portion on the photoelectric converter side of the through hole; and
  filling the through hole with a metal film.

REFERENCE SIGNS LIST 1 solid-state imaging device
10 pixel array
32 vertical drive circuit
34 column signal processing circuit
36 horizontal drive circuit
38 output circuit
40 control circuit
42 pixel drive wiring
44 vertical signal line
46 horizontal signal line
48 input/output terminal
100, 100a, 100b solid-state image sensor
200, 200a, 300, 400 photoelectric conversion element 202 upper electrode
204 photoelectric conversion film
206 lower electrode
208 accumulation electrode
500 semiconductor substrate
502, 510, 512, 516 semiconductor region
514 floating diffusion
520 wiring layer
522 wiring
524 gate electrode
530 interlayer insulating film
540, 552, 560, 604, 804 insulating film
550, 650 fixed charge film
570 metal wiring
580 high-refractive index layer
582 planarization film
590 on-chip lens
600, 600a, 600b, 800 through electrode
602, 602a, 602c, 802 conductor
602b, 602d branch portion
606, 606a, 606b, 806 through hole
606c opening end
610 center axis
620 depression
808 void
900 electronic device
902 imaging device
910 optical lens
912 shutter mechanism
914 drive circuit unit
916 signal processing circuit unit

What is claimed is:

1. A solid-state image sensor, comprising:
a semiconductor substrate;
a charge accumulator disposed in the semiconductor substrate and configured to accumulate charge;
a photoelectric converter disposed above the semiconductor substrate and configured to convert light to charge; and
a through electrode passing through the semiconductor substrate and electrically connecting the charge accumulator with the photoelectric converter,
wherein, at an end portion on a photoelectric converter side of the through electrode, a cross-sectional area of a conductor positioned at a center of the through electrode in a cut section orthogonal to a through direction of the through electrode gradually increases toward the photoelectric converter along the through direction, and
wherein, in a cross section of the through electrode cut along the through direction, an end portion on a photoelectric converter side of the conductor has two first branch portions split from a center axis of the conductor.

2. The solid-state image sensor according to claim 1, wherein the through electrode electrically connects the photoelectric converter with at least one or more pixel transistors disposed in the semiconductor substrate.

3. The solid-state image sensor according to claim 1, further comprising an insulating film covering an outer periphery of the conductor of the through electrode.

4. The solid-state image sensor according to claim 1, wherein the end portion on the photoelectric converter side of the conductor further has a depression positioned between the two first branch portions.

5. The solid-state image sensor according to claim 1, wherein each of the first branch portions is bent.

6. The solid-state image sensor according to claim 5, wherein each of the first branch portions is bent with a radius of curvature of 10 nm or more and 1000 nm or less.

7. The solid-state image sensor according to claim 1, wherein in a cross section of the through electrode cut along the through direction, an end portion on the charge accumulator side of the conductor has two second branch portions split from the center axis.

8. The solid-state image sensor according to claim 7, wherein each of the first branch portions and each of the second branch portions are bent.

9. The solid-state image sensor according to claim 8, wherein a radius of curvature of the first branch portion is larger than a radius of curvature of the second branch portion.

10. The solid-state image sensor according to claim 1, wherein the end portion on the photoelectric converter side of the conductor electrically connects with wiring including a transparent conductor.

11. The solid-state image sensor according to claim 1, wherein
the photoelectric converter includes
a common electrode shared between solid-state image sensors adjacent to each other,
a readout electrode electrically connected to the through electrode, and
a photoelectric conversion film sandwiched between the common electrode and the readout electrode and configured to convert light to charge.

12. The solid-state image sensor according to claim 11, wherein the photoelectric conversion film includes an organic material.

13. The solid-state image sensor according to claim 1, further comprising another photoelectric converter disposed in the semiconductor substrate and configured to convert light to charge.

14. A solid-state image sensor, comprising:
a semiconductor substrate;
a charge accumulator disposed in the semiconductor substrate and configured to accumulate charge;
a photoelectric converter disposed above the semiconductor substrate and configured to convert light to charge; and
a through electrode passing through the semiconductor substrate and electrically connecting the charge accumulator with the photoelectric converter,
wherein at an end portion on a photoelectric converter side of the through electrode, a cross-sectional area of a conductor positioned at a center of the through electrode in a cut section orthogonal to a through direction of the through electrode gradually increases toward the photoelectric converter along the through direction,
wherein the photoelectric converter includes:
a common electrode shared between solid-state image sensors adjacent to each other,
a readout electrode electrically connected to the through electrode,
a photoelectric conversion film sandwiched between the common electrode and the readout electrode and configured to convert light to charge, and
an accumulation electrode facing the common electrode with the photoelectric conversion film and an insulating film interposed therebetween.

15. The solid-state image sensor according to claim 14, wherein a gradient of an outer peripheral surface at the end portion on a photoelectric converter side of the conductor has an angle of 1° or more and 60° or less with respect to a center axis of the conductor extending in the through direction.

16. The solid-state image sensor according to claim 14, wherein the conductor has a substantially cylindrical shape.

17. The solid-state image sensor according to claim 16, wherein a diameter of the conductor in the cut section on a photoelectric converter side is 1.2 times or more a diameter of the conductor in the cut section on the charge accumulator side.

18. The solid-state image sensor according to claim 14, wherein, in a cross section of the through electrode cut along the through direction, the end portion on a photoelectric converter side of the conductor has two first branch portions split from a center axis of the conductor.

19. The solid-state image sensor according to claim 18, wherein the end portion on the photoelectric converter side of the conductor further has a depression positioned between the two first branch portions.

20. A solid-state imaging device comprising a plurality of solid-state image sensors arranged in a matrix, each of the solid-state image sensors comprising:
a semiconductor substrate;
a charge accumulator disposed in the semiconductor substrate and configured to accumulate charge;
a photoelectric converter disposed above the semiconductor substrate and configured to convert light to charge; and
a through electrode passing through the semiconductor substrate and electrically connecting the charge accumulator with the photoelectric converter,
wherein, at an end portion on a photoelectric converter side of the through electrode, a cross-sectional area of a conductor positioned at a center of the through electrode in a cut section orthogonal to a through direction of the through electrode gradually increases toward the photoelectric converter along the through direction, and
wherein, in a cross section of the through electrode cut along the through direction, an end portion on a photoelectric converter side of the conductor has two first branch portions split from a center axis of the conductor.

* * * * *